United States Patent
Mochizuki

(10) Patent No.: US 9,880,235 B2
(45) Date of Patent: Jan. 30, 2018

(54) MAGNETIC SUBSTANCE DETECTION DEVICE

(71) Applicant: Hamamatsu Kohden Co., Ltd., Iwata-Shi (JP)

(72) Inventor: Shinsuke Mochizuki, Hamamatsu (JP)

(73) Assignee: Hamamatsu Kohden Co., Ltd., Iwata-Shi, Shizuoka-Ken (JP)

( * ) Notice: Subject to any disclaimer, the term of this patent is extended or adjusted under 35 U.S.C. 154(b) by 259 days.

(21) Appl. No.: 14/763,917

(22) PCT Filed: Mar. 18, 2014

(86) PCT No.: PCT/JP2014/057219
§ 371 (c)(1),
(2) Date: Jul. 28, 2015

(87) PCT Pub. No.: WO2014/156793
PCT Pub. Date: Oct. 2, 2014

(65) Prior Publication Data
US 2015/0369882 A1 Dec. 24, 2015

(30) Foreign Application Priority Data
Mar. 26, 2013 (JP) .................................. 2013-064071

(51) Int. Cl.
*G01R 33/09* (2006.01)
*H01F 7/02* (2006.01)
*H01F 13/00* (2006.01)

(52) U.S. Cl.
CPC ......... *G01R 33/093* (2013.01); *H01F 7/0278* (2013.01); *H01F 7/0294* (2013.01); *H01F 13/003* (2013.01)

(58) Field of Classification Search
CPC ......... G01R 33/09; G01R 33/096; G07D 7/04
See application file for complete search history.

(56) References Cited

U.S. PATENT DOCUMENTS 4,725,776 A * 2/1988 Onodera ................. G01P 3/488
324/207.21
5,450,009 A 9/1995 Murakami
(Continued)

FOREIGN PATENT DOCUMENTS

JP 51-87449 U 7/1976
JP 04-094581 U 8/1992
(Continued)

OTHER PUBLICATIONS

International Search Report and Written Opinion (Application No. PCT/JP2014/057219) dated Jun. 24, 2014.

*Primary Examiner* — Walter L Lindsay, Jr.
*Assistant Examiner* — Milton Gonzalez
(74) *Attorney, Agent, or Firm* — Burr & Brown, PLLC

(57) ABSTRACT

A magnetic substance detection device includes elongated magnets and ferromagnetic thin film magnetoresistance elements. The magnets extend in parallel with a Y-axis direction and are magnetized opposite to each other in a Z-axis direction. The ferromagnetic thin film magnetoresistance elements have respective linear segments extending substantially along the Y-axis direction on a plane of a substrate disposed in a path of lines of magnetic force between the magnets and change their resistances in response to a change in a magnetic field directed in a direction orthogonal to the Y-axis direction in the plane of the substrate. The magnets apply bias magnetic fields lower in intensity than a saturated magnetic field of the ferromagnetic thin film magnetoresistance elements to the ferromagnetic thin film magnetoresistance elements, respectively, in the direction orthogonal to the Y-axis direction in the plane of the substrate.

7 Claims, 13 Drawing Sheets

(56) References Cited

U.S. PATENT DOCUMENTS

| | | | | |
|---|---|---|---|---|
| 2008/0238417 A1* | 10/2008 | Suzuki | .................. | G01R 33/12 |
| | | | | 324/228 |
| 2013/0127457 A1* | 5/2013 | Musha | .................. | B82Y 25/00 |
| | | | | 324/252 |
| 2014/0367469 A1* | 12/2014 | Schutzmann | ......... | G06K 7/087 |
| | | | | 235/450 |

FOREIGN PATENT DOCUMENTS

| | | | | | |
|---|---|---|---|---|---|
| JP | 04364498 | A | * | 12/1992 | |
| JP | 11-311542 | A1 | | 11/1999 | |
| JP | 2004-038611 | A1 | | 2/2004 | |
| JP | 3105238 | U | | 10/2004 | |
| JP | 2005-030872 | A1 | | 2/2005 | |
| JP | 2008-145302 | A1 | | 6/2008 | |
| JP | 2008-145379 | A1 | | 6/2008 | |
| JP | 4894040 | B2 | | 3/2012 | |
| WO | WO 2012014546 | A1 | * | 2/2012 | ............. B82Y 25/00 |

\* cited by examiner (A)

(B)

(A)

(B)

(A)

(B)

MAGNETIC SUBSTANCE DETECTION DEVICE

BACKGROUND OF THE INVENTION

1. Field of the Invention

The present invention relates to a magnetic substance detection device for detecting a magnetic substance contained in a moving object to be verified.

2. Description of Related Art

As is conventionally known, magnetic ink is applied by printing onto objects to be verified, such as paper money and securities, or a strip of magnetic substance is incorporated into the objects by a paper making technique; and, in a distribution stage, the objects to be verified are moved in a fixed direction and inspected for a magnetic substance expected to be contained therein, thereby judging genuineness thereof.

As is disclosed in, for example, Patent Document 1 mentioned below, a magnetic substance detection device for use in such a case is configured as follows: a ferromagnetic thin film magnetoresistance element having a linear segment extending orthogonally to a moving direction of a magnetic substance is formed on the upper surface of a flat substrate; the flat substrate is disposed under a path of moving the magnetic substance in such a manner as to be inclined with respect to the moving direction of the magnetic substance; one magnet is disposed under the substrate and generates lines of magnetic force which pass through the ferromagnetic thin film magnetoresistance element along elliptic magnetic paths; and by use of a change in resistance of the ferromagnetic thin film magnetoresistance element in response to movement of the magnetic substance, the existence of the magnetic substance is detected. In this case, the magnet generates lines of magnetic force which pass through the substrate perpendicular to the substrate in the vicinity of the ferromagnetic thin film magnetoresistance element, so as to apply a bias magnetic field (a magnetic field produced by the magnet in a state in which the magnetic substance does not exist) lower in intensity than a saturated magnetic field of the ferromagnetic thin film magnetoresistance element to the ferromagnetic thin film magnetoresistance element in a direction orthogonal to the extending direction of the linear segment of the ferromagnetic thin film magnetoresistance element in the plane of the substrate, whereby the ferromagnetic thin film magnetoresistance element changes resistance in response to a change, caused by movement of the magnetic substance, in a magnetic field directed in a direction orthogonal to the extending direction of the linear segment of the ferromagnetic thin film magnetoresistance element in the plane of the substrate.

PRIOR ART DOCUMENT

Patent Document

Patent Document 1: Japanese Patent No. 4894040

SUMMARY OF THE INVENTION

However, since the above-mentioned change of resistance of the ferromagnetic thin film magnetoresistance element is effected through utilization of a small change of a magnetic field directed in a direction orthogonal to the extending direction of the linear segment of the ferromagnetic thin film magnetoresistance element, if the magnitude of the bias magnetic field varies, a change of the resistance in response to movement of the magnetic substance varies greatly. The direction and distribution of lines of magnetic force generated from the magnet depend on the shape of the magnet; particularly, the shape of a magnetic pole face of the magnet located toward the ferromagnetic thin film magnetoresistance element. Therefore, unless the magnet is formed with high accuracy such that no error is involved in formation of the shape of the magnet; particularly, the shape of the magnetic pole face of the magnet located toward the ferromagnetic thin film magnetoresistance element, detecting a change in resistance of the ferromagnetic thin film magnetoresistance element; i.e., detecting a moving magnetic substance, cannot be performed with high accuracy.

The present invention has been conceived to cope with the above problem, and an object of the invention is to provide a magnetic substance detection device which, even though a magnet adapted to apply a bias magnetic field to a ferromagnetic thin film magnetoresistance element is formed with some error involved, can detect a change in resistance of the ferromagnetic thin film magnetoresistance element; i.e., a moving magnetic substance, with high accuracy. In the following description of the constituent features of the invention, for easy understanding of the present invention, the constituent features are accompanied by parenthesized reference numerals of corresponding components of embodiments; however, the accompaniment of reference numerals should not be construed as limiting the constituent features of the invention to the corresponding components of the embodiments.

In order to achieve the above object, a feature of the present invention is a magnetic substance detection device for detecting a magnetic substance (MS) contained in an object (OB) to be verified which moves in a first direction (X-axis direction), comprising an elongated first magnet (12) and an elongated second magnet (13) which extend in parallel with a second direction (Y-axis direction) orthogonal to the first direction and are magnetized opposite to each other in a third direction (Z-axis direction) orthogonal to the first and second directions, and a magnetic sensor having a ferromagnetic thin film magnetoresistance element (23, 24, 23-1, 23-2, 24-1, 24-2) which has a linear segment extending substantially along the second direction on a plane of a substrate (22) disposed in a path of lines of magnetic force between the first magnet and the second magnet and changes resistance thereof in response to a change of a magnetic field directed in a direction orthogonal to the second direction in the plane of the substrate, the magnetic substance detection device being characterized in that the first magnet and the second magnet apply a bias magnetic field lower in intensity than a saturated magnetic field of the ferromagnetic thin film magnetoresistance element to the ferromagnetic thin film magnetoresistance element in the direction orthogonal to the second direction in the plane of the substrate.

In the thus-configured present invention, the first magnet and the second magnet are elongated and extend in parallel with the second direction, and are magnetized opposite to each other in the third direction. Thus, the first magnet and the second magnet generate lines of magnetic force elliptically in a plane orthogonal to the second direction; and, even though some error is involved in formation of the shapes of the first and second magnets, particularly, the shapes of magnetic pole faces, the lines of magnetic force are stabilized in direction, and the lines of magnetic force passing through the ferromagnetic thin film magnetoresistance element are fixed in direction at all times. As a result, the bias magnetic field applied to the ferromagnetic thin film magnetoresistance element and directed in the direction orthogonal to the second direction in the plane of the substrate is stabilized without involvement of fluctuations, so that there can be stabilized a change in resistance of the ferromagnetic thin film magnetoresistance element in response to movement of the magnetic substance, and the magnetic substance can be detected with high accuracy. Also, through adjustment of the distance between the first magnet and the second magnet, the shape of a path of lines of magnetic force can be modified in various manners, thereby facilitating setting of the bias magnetic field applied in the aforementioned direction to the ferromagnetic thin film magnetoresistance element. Furthermore, by virtue of provision of the first magnet and the second magnet, magnetic force in the second direction and magnetic force in a plane orthogonal to the second direction can be stabilized over a wide range along the second direction, so that the existence of the magnetic substance can be accurately detected over a wide range along the second direction.

Another feature of the present invention is that the plane of the substrate is inclined with respect to the first direction, and the linear segment of the ferromagnetic thin film magnetoresistance element extends on the plane of the substrate and is inclined by a predetermined angle with respect to the second direction in the plane of the substrate.

According to this configuration, by means of the difference between components in the third direction of lines of magnetic force generated by the first and second magnets at opposite ends of the ferromagnetic thin film magnetoresistance element, magnetic flux in a fixed direction is generated in the ferromagnetic thin film magnetoresistance element along the extending direction of the ferromagnetic thin film magnetoresistance element, whereby a change in resistance of the ferromagnetic thin film magnetoresistance element can be stabilized.

A further feature of the present invention is the provision of a covering member which is formed of a magnetic substance and covers magnetic pole faces of the first and second magnets opposite the magnetic sensor.

According to this configuration, the distribution of lines of magnetic force generated by the first and second magnets on a side toward the ferromagnetic thin film magnetoresistance element can be free from influence of an external magnetic field and thus stabilized, whereby accuracy in detecting the magnetic substance can be enhanced.

A still further feature of the present invention is that the magnetic sensor has a first magnetoresistance element and a second magnetoresistance element which, at the same position along the second direction on the plane of the substrate, are formed of respective ferromagnetic thin film magnetoresistance elements having linear segments facing each other, and the plane of the substrate is inclined by a predetermined angle with respect to the first direction such that lines of magnetic force generated by the first and second magnets pass through the plane of the substrate in such a manner as to be perpendicular to the plane of the substrate at a center position between the first magnetoresistance element and the second magnetoresistance element, so that the bias magnetic field applied in said direction to the first magnetoresistance element becomes substantially opposite in direction to the bias magnetic field applied in said direction to the second magnetoresistance element.

According to this configuration, the bias magnetic fields applied in a direction orthogonal to the extending direction of the first and second magnetoresistance elements in the plane of the substrate are directed substantially in opposite directions and have the same magnitude, so that the first magnetoresistance element and the second magnetoresistance element can change their resistances substantially symmetrically in mutually opposite positive and negative directions in response to the movement of the magnetic substance in the first direction, thereby facilitating utilization of a change in resistances of the first and second magnetoresistance elements.

Yet another feature of the present invention is the provision of an electric circuit (31) in which the first magnetoresistance element (23) and the second magnetoresistance element (24) are connected in series, and a predetermined voltage is applied between opposite ends of the connected first and second magnetoresistance elements for outputting voltage at a point of connection between the first magnetoresistance element and the second magnetoresistance element.

According to this configuration, since the first magnetoresistance element and the second magnetoresistance element are half-bridge-connected, a large output voltage can be obtained.

Another feature of the present invention is that the magnetic sensor further has a third magnetoresistance element (23-2) and a fourth magnetoresistance element (24-2) provided at positions extended in the second direction from the first magnetoresistance element (23-1) and the second magnetoresistance element (24-1) on the plane of the substrate, the third and fourth magnetoresistance elements being formed of respective ferromagnetic thin film magnetoresistance elements and having linear segments which extend substantially along the second direction on the plane of the substrate and which face each other, and the third and fourth magnetoresistance elements having resistances which change in response to a change in a magnetic field directed in a direction orthogonal to the second direction in the plane of the substrate;

the magnetic substance detection device is configured such that lines of magnetic force generated by the first and second magnets pass through the plane of the substrate in such a manner as to be perpendicular to the plane of the substrate at a center position between the third magnetoresistance element and the fourth magnetoresistance element, so that the bias magnetic field applied in said direction to the third magnetoresistance element becomes substantially opposite in direction to the bias magnetic field applied in said direction to the fourth magnetoresistance element, and the bias magnetic field applied in said direction to the third magnetoresistance element becomes the same in direction as the bias magnetic field applied in said direction to the first magnetoresistance element; and the magnetic substance detection device further comprises an electric circuit (32) in which a terminal of the first magnetoresistance element located toward the third magnetoresistance element is connected to a terminal of the fourth magnetoresistance element located toward the second magnetoresistance element, a terminal of the second magnetoresistance element located toward the fourth magnetoresistance element is connected to a terminal of the third magnetoresistance element located toward the first magnetoresistance element, a terminal of the first magnetoresistance element located opposite the third magnetoresistance element is connected to a terminal of the second magnetoresistance element located opposite the fourth magnetoresistance element, a terminal of the third magnetoresistance element located opposite the first magnetoresistance element is connected to a terminal of the fourth magnetoresistance element located opposite the second magnetoresistance element, and a predetermined voltage is applied between a point of connection between the first magnetoresistance element and the second magnetoresistance element and a point of connection between the third magnetoresistance element and the fourth magnetoresistance element for outputting a differential voltage between a voltage at the point of connection between the first magnetoresistance element and the fourth magnetoresistance element and a voltage at the point of connection between the second magnetoresistance element and the third magnetoresistance element.

According to this configuration, since the first magnetoresistance element, the second magnetoresistance element, the third magnetoresistance element, and the fourth magnetoresistance element are full-bridge-connected, the output voltage can be two times that in the case of the aforementioned half bridge connection. Also, the electric circuit outputs a differential voltage between a voltage at the point of connection between the first magnetoresistance element and the fourth magnetoresistance element and a voltage at the point of connection between the second magnetoresistance element and the third magnetoresistance element, whereby, even though noises are contained respectively in the bias magnetic field which brings about a change in resistances of the first magnetoresistance element and the third magnetoresistance element, and in the bias magnetic field which brings about a change in resistances of the second magnetoresistance element and the fourth magnetoresistance element, the changes in resistances caused by the noises cancel each other, thereby improving the S/N ratio of the output voltage.

A further feature of the present invention is that the magnetic sensor further has a third magnetoresistance element (23-2) and a fourth magnetoresistance element (24-2) provided at positions extended in the second direction from the first magnetoresistance element (23-1) and the second magnetoresistance element (24-1) on the plane of the substrate, the third and fourth magnetoresistance elements being formed of respective ferromagnetic thin film magnetoresistance elements and having linear segments which extend substantially along the second direction on the plane of the substrate and which face each other, and the third and fourth magnetoresistance elements having resistances which change in response to a change in a magnetic field directed in a direction orthogonal to the second direction in the plane of the substrate: the magnetic substance detection device is configured such that lines of magnetic force generated by the first and second magnets pass through the plane of the substrate in such a manner as to be perpendicular to the plane of the substrate at a center position between the third magnetoresistance element and the fourth magnetoresistance element, so that the bias magnetic field applied in said direction to the third magnetoresistance element becomes substantially opposite in direction to the bias magnetic field applied in said direction to the fourth magnetoresistance element, and the bias magnetic field applied in said direction to the third magnetoresistance element becomes the same in direction as the bias magnetic field applied in said direction to the first magnetoresistance element; and the magnetic substance detection device further comprises an electric circuit (32) in which a terminal of the first magnetoresistance element located opposite the third magnetoresistance element is connected to a terminal of the second magnetoresistance element located opposite the fourth magnetoresistance element, a terminal of the third magnetoresistance element located opposite the first magnetoresistance element is connected to a terminal of the fourth magnetoresistance element located opposite the second magnetoresistance element, a terminal of the first magnetoresistance element located toward the third magnetoresistance element is connected to a terminal of the fourth magnetoresistance element located toward the second magnetoresistance element, a terminal of the second magnetoresistance element located toward the fourth magnetoresistance element is connected to a terminal of the third magnetoresistance element located toward the first magnetoresistance element, and a predetermined voltage is applied between a point of connection between the first magnetoresistance element and the fourth magnetoresistance element and a point of connection between the second magnetoresistance element and the third magnetoresistance element for outputting a differential voltage between a voltage at the point of connection between the first magnetoresistance element and the second magnetoresistance element and a voltage at the point of connection between the third magnetoresistance element and the fourth magnetoresistance element.

According to this configuration also, since the first magnetoresistance element, the second magnetoresistance element, the third magnetoresistance element, and the fourth magnetoresistance element are full-bridge-connected, the output voltage can be two times that in the case of the aforementioned half bridge connection. In this case also, the electric circuit outputs a differential voltage between a voltage at the point of connection between the first magnetoresistance element and the second magnetoresistance element and a voltage at the point of connection between the third magnetoresistance element and the fourth magnetoresistance element, whereby, even though noises are contained respectively in the bias magnetic field which brings about a change in resistances of the first magnetoresistance element and the third magnetoresistance element, and in the bias magnetic field which brings about a change in resistances of the second magnetoresistance element and the fourth magnetoresistance element, the changes in resistances caused by the noises cancel each other, thereby improving the S/N ratio of the output voltage.

A still further feature of the present invention is the provision of a magnetizer (40) disposed at a position located away from the magnetic sensor and adapted to magnetize the magnetic substance before the magnetic sensor detects the magnetic substance.

According to this configuration, even though the magnetic substance formed of a hard magnetic substance is magnetized in various ways before inspection, since the magnetizer magnetizes the magnetic substance into a fixed condition at all times, the output voltage is in a fixed condition at all times, so that the existence of the magnetic substance can be accurately detected.

Furthermore, the present invention can be embodied in a magnetic substance detection method for detecting a magnetic substance contained in a moving object to be verified.

DETAILED DESCRIPTION OF THE INVENTION a. First Embodiment

Figure 1:
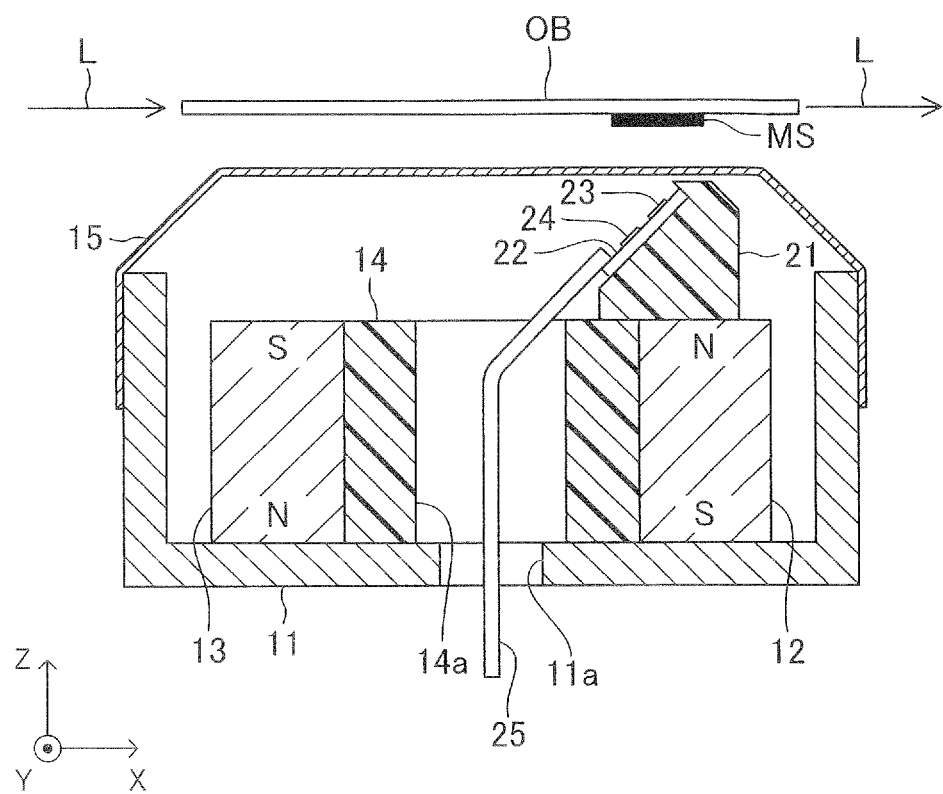
FIG. 1 Schematic longitudinal sectional view of a magnetic substance detection device according to a first embodiment of the present invention.
Figure 2:
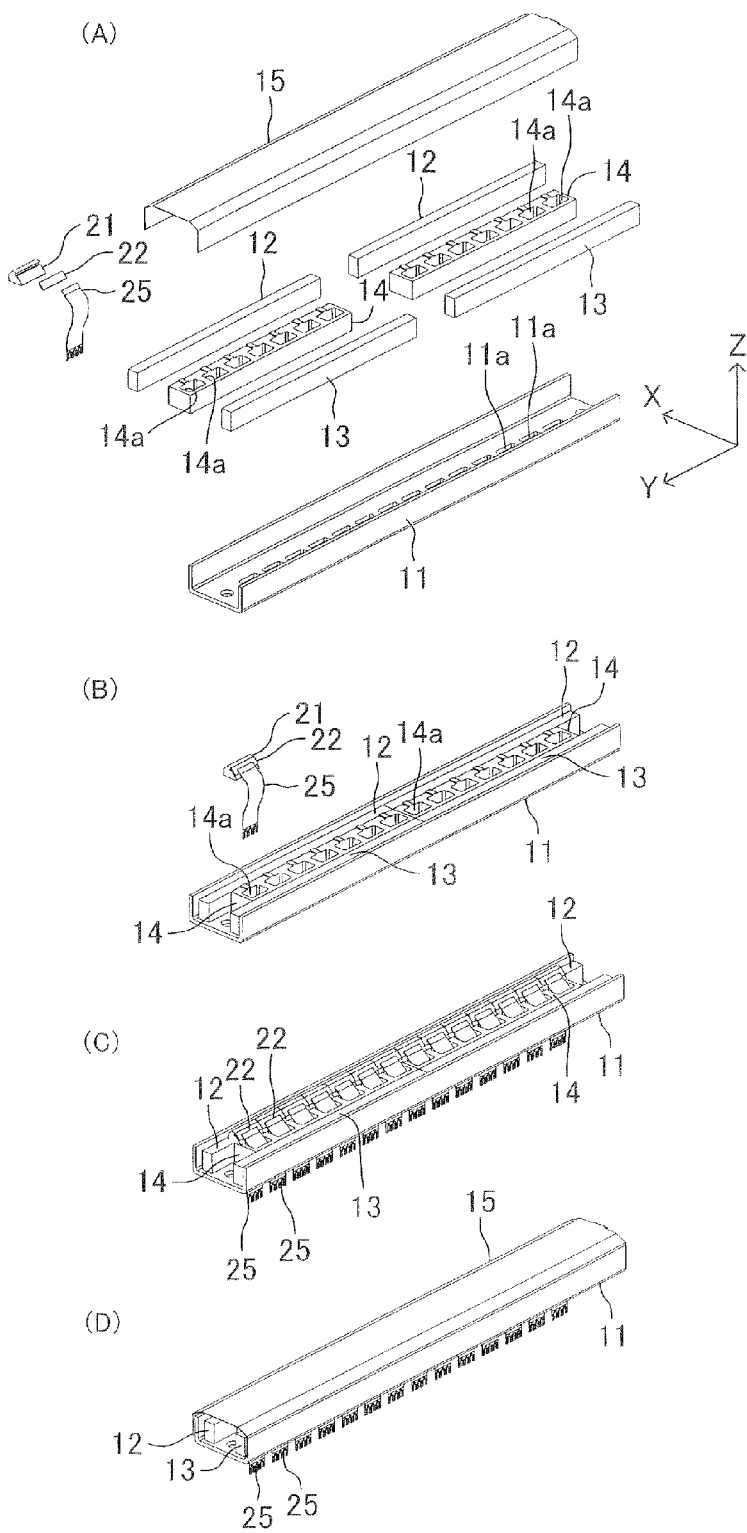
FIG. 2 (A) is an exploded perspective view of the magnetic substance detection device, and (B) to (D) are perspective views showing how the magnetic substance detection device is assembled.

First, a magnetic substance detection device according to a first embodiment of the present invention will be described with reference to the drawings. FIG. 1 is a schematic longitudinal sectional view of the magnetic substance detection device. FIG. 2(A) is an exploded perspective view of the magnetic substance detection device, and FIGS. 2(B), 2(C), and 2(D) are perspective views showing how the magnetic substance detection device is assembled.

An object OB to be verified which is expected to contain a magnetic substance MS is moved rectilinearly in a direction indicated by the arrows in a plane which contains a moving direction L (X-axis direction), and the magnetic substance detection device is used to judge genuineness of the object OB to be verified. The object OB to be verified, such as paper money or securities, contains magnetic ink applied by printing or a strip of magnetic substance incorporated by a paper making technique. The magnetic substance detection device is disposed under the plane which contains the moving direction L of the object OB to be verified, and detects whether or not the magnetic substance MS exists, through utilization of a change in lines of magnetic force caused by movement of the magnetic substance MS contained in the object OB to be verified. Although unillustrated, the object OB to be verified is moved by use of conveyor plates, rollers, etc.

The magnetic substance detection device includes a case 11, magnets 12 and 13, magnet fixing members 14, a cover 15 as well as substrate support members 21, substrates 22, ferromagnetic thin film magnetoresistance elements 23 and 24, and flexible printed circuit substrates 25.

The case 11 is a support member which is formed of a magnetic material (e.g., stainless steel, which is a soft magnetic substance), has a substantially U-shaped section taken along an X-Z plane, and is elongated in a Y-axis direction, and which opens upward in a Z-axis direction. The magnets 12 and 13 are permanent magnets formed of ferrite magnets, have a rectangular section taken along the X-Z plane, are elongated in the Y-axis direction, and are magnetized opposite to each other in the Z-axis direction. The magnets 12 and 13 have the same shape. In the present embodiment, the magnet 12 has the North Pole at an upper magnetic pole face in the Z-axis direction and the South Pole at a lower magnetic pole face, whereas the magnet 13 has the South Pole at the upper magnetic pole face in the Z-axis direction and the North Pole at the lower magnetic pole face. The case 11 is the covering member in the present invention and covers the magnetic pole faces of the magnets 12 and 13 located opposite the ferromagnetic thin film magnetoresistance elements 23 and 24. The case 11 has a plurality of rectangular through holes 11a formed in its bottom and arrayed along a longitudinal direction thereof.

The magnet fixing members 14 are formed of resin, have a rectangular section taken along the X-Z plane, and are elongated in the Y-axis direction. The magnet fixing members 14 keep the magnets 12 and 13 in parallel with each other with a predetermined distance in the X-axis direction therebetween and have a plurality of rectangular through holes 14a formed in a central region with respect to the X-axis direction and extending therethrough in the Z-axis direction between the upper and lower surfaces thereof. The length (height) in the Z-axis direction of the magnet fixing members 14 is equal to the length (height) in the Z-axis direction of the magnets 12 and 13, and the through holes 14a face the through holes 11a, respectively, of the case 11.

The cover 15 is formed of an elastic nonmagnetic material having high rigidity (e.g., stainless steel), has a substantially U-shaped section taken along the X-Z plane, is elongated in the Y-axis direction, and opens downward in the Z-axis direction. The cover 15 covers the magnets 12 and 13, the magnet fixing members 14, the substrate support members 21, the substrates 22, and the flexible printed circuit substrates 25 which are assembled to the case 11.

The case 11 and the cover 15 have the same length in the Y-axis direction, and the length in the Y-axis of the magnets 12 and 13 is slightly shorter than half the length in the Y-axis direction of the case 11 and the cover 15. The length in the Y-axis direction of the magnet fixing members 14 is slightly shorter than that of the magnets 12 and 13. As shown in FIG. 2(B), a plurality of the magnet fixing members 14 (in the present embodiment, two magnet fixing members 14) are fixed to the inner bottom surface of the case 11 in a central region with respect to the X-axis direction while extending in the Y-axis direction. A plurality of the magnets 12 and a plurality of the magnets 13 (in the present embodiment, two magnets 12 and two magnets 13) are fixed to corresponding opposite side surfaces, with respect to the X-axis direction, of the magnet fixing members 14. In this case, the lower surfaces, with respect to the Z-axis direction, of the magnets 12 and 13 are fixed to the inner bottom surface of the case 11 and gaps are formed between the outer side surfaces, with respect to the X-axis direction, of the magnets 12 and 13 and the inner side surfaces, with respect to the X-axis direction, of the case 11, respectively. A plurality of the magnets 12 are brought in contact with one another in the Y-axis direction, and a plurality of the magnets 13 are brought in contact with one another in the Y-axis direction; however, some gap (e.g., a gap of 0.2 mm or less) may exist therebetween.

The substrate support member 21 is formed of a synthetic resin and elongated in the Y-axis direction. The substrate support member 21 has a right-angled triangular section orthogonal to the Y-axis direction (a section in the X-Z plane), and its hypotenuse is inclined by about 45 degrees with respect to the other two sides. The length along the Y-axis direction of the substrate support member 21 is substantially equal to a length obtained by dividing the length along the Y-axis direction of one magnet fixing member 14 by the number of the through holes 14a, and a plurality of (in the present embodiment, two times the number of the through holes 14a of one magnet fixing member 14; i.e., 14) the substrate supporting members 21 are prepared. A plurality of the substrate support members 21 are disposed on the upper surface of the magnet 12 and on the upper surface of the magnet fixing member 14 located toward the magnet 12, in a row with their longitudinal direction aligned with the Y-axis direction at positions along the Y-axis direction of the through holes 14a of the magnet fixing member 14 and are fixed at their bottom surfaces to the upper surfaces. Therefore, the inclined surface of the substrate support member 21 forms an angle of about 45 degrees with respect to the X-Y plane; i.e., the upper surfaces of the magnets 12 and 13. The angle of the inclined surface of the substrate support member 21 and the upper surface of the substrate 22 with respect to the X-Y plane; i.e., the upper surfaces of the magnets 12 and 13, is not necessarily about 45 degrees, but may be within a range of 10 degrees to 65 degrees.

The substrate 22 is formed from a nonmagnetic material into a flat plate shape having substantially the same size as that of the inclined surface of the substrate support member 21 and is fixedly affixed at the back surface to the inclined surface of the substrate support member 21. The number of the substrates 22 is equal to that of the substrate support members 21. At least the upper surface of the substrate 22 is flat and forms an angle of about 45 degrees with respect to the X-Y plane. The ferromagnetic thin film magnetoresistance elements 23 and 24 are magnetoresistance elements (e.g., AMR elements) which are formed from a ferromagnetic magnetoresistance material into thin films on the upper surface of the substrate 22 by sputtering or a like process. In the following description, for simplification, the ferromagnetic thin film magnetoresistance elements 23 and 24 are referred to merely as the magnetoresistance elements 23 and 24. The magnetoresistance elements 23 and 24 have respective linear segments extending rectilinearly substantially in the Y-axis direction and are formed in parallel with the Y-axis direction on the upper surface of the substrate 22 with the linear segments facing each other. The magnetoresistance elements 23 and 24 change their resistances between their opposite ends along their extending direction (Y-axis direction) according to the intensity of a magnetic field (magnetic force) in a plane orthogonal to the Y-axis direction in the upper plane of the substrate 22.

According to the above description, the magnetoresistance elements 23 and 24 have the respective linear segments which extend rectilinearly substantially in the Y-axis direction; however, the extending directions of the magnetoresistance elements 23 and 24; i.e., the linear segments of the magnetoresistance elements 23 and 24, are provided on the upper surface (plane) of the substrate 22 in such a manner as to be inclined by a predetermined angle with respect to the Y-axis direction. The predetermined angle ranges from one degree to 45 degrees.

Figure 3:
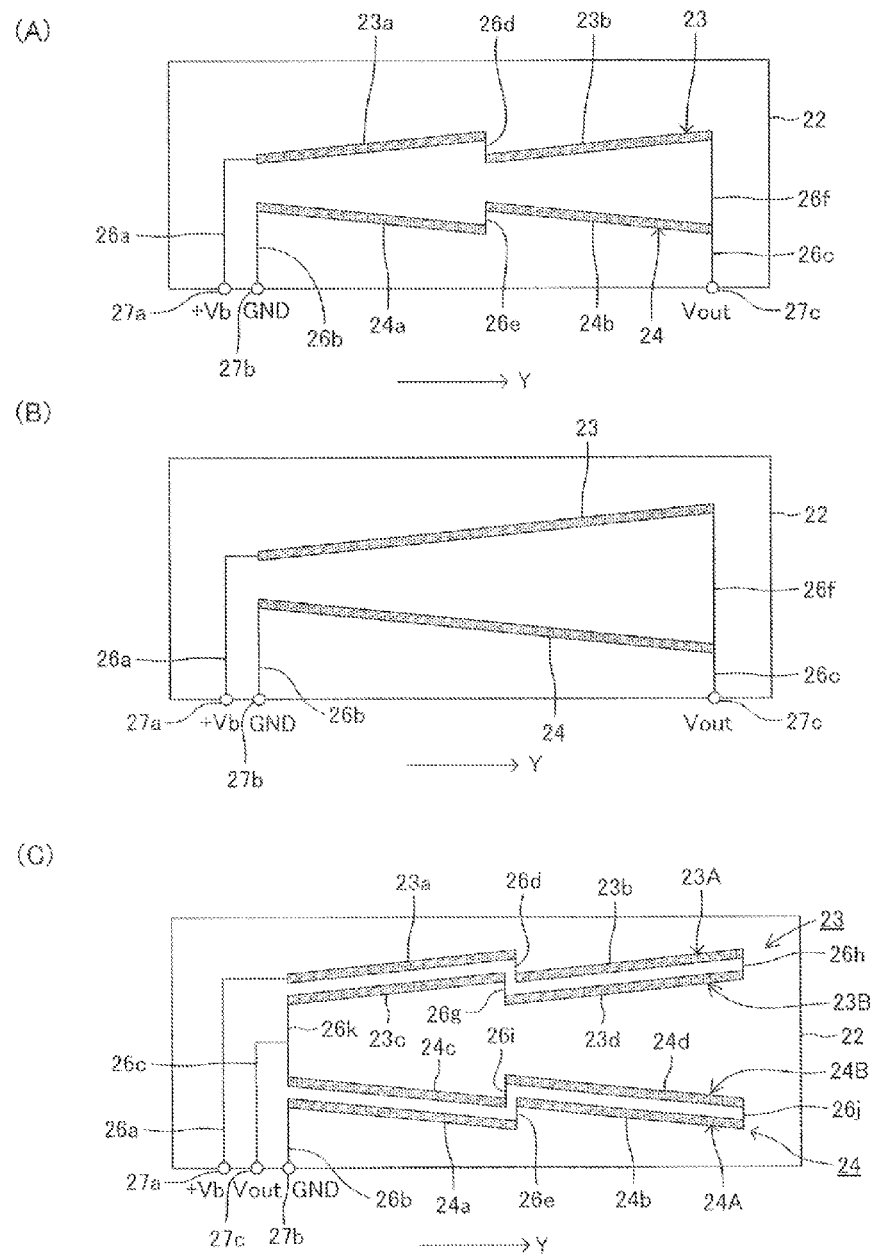
FIG. 3 (A) is a plan view showing an example of magnetoresistance elements on a substrate, and (B) and (C) are plan views showing other examples of the magnetoresistance elements on the substrate.

This feature will be described specifically; as shown in FIG. 3(A), the magnetoresistance elements 23 and 24 have, for example, two linear subsegments 23a and 23b and two linear subsegments 24a and 24b, respectively, formed by splitting the respective linear segments extending substantially in the Y-axis direction; and the linear subsegments 23a. 23b, 24a, and 24b are provided on the upper surface of the substrate 22 in such a manner as to be inclined with respect to the Y-axis direction. In the present embodiment, the linear subsegments 23a and 23b ascend at their illustrated right ends, and the linear subsegments 24a and 24b descend at their illustrated right ends; however, the linear subsegments 23a, 23b, 24a, and 24b may be inclined in either direction so long as the linear subsegments 23a and 23b are inclined in the same direction, and the linear subsegments 24a and 24b are inclined in the same direction. One ends of the linear subsegments 23a and 24a are connected to terminals 27a and 27b provided on the substrate 22 through conductors 26a and 26b, respectively. The other end of the linear subsegment 23a is connected to one end of the linear subsegment 23b through a conductor 26d; the other end of the linear subsegment 24a is connected to one end of the linear subsegment 24b through a conductor 26e; the other ends of the linear subsegments 23b and 24b are connected to each other through a conductor 26f; and, thus, the magnetoresistance element 23 composed of the linear subsegments 23a and 23b, and the magnetoresistance element 24 composed of the linear subsegments 24a and 24b are connected in series. A point of connection between the magnetoresistance elements 23 and 24; i.e., a point of connection between the linear subsegments 23b and 24b, is connected to a terminal 27c through a conductor 26c. The conductors 26a to 26f are formed from an electrically conductive material (nonmagnetic material) on the upper surface of the substrate 22 by sputtering or a like process. The terminals 27a and 27b are adapted to apply a voltage (+Vb, GND) between the magnetoresistance elements 23 and 24 connected in series, and the terminal 27c is adapted to output a voltage between the magnetoresistance elements 23 and 24 as an output voltage Vout. The two magnetoresistance elements 23 and 24 (linear subsegments 23a, 23b, 24a, and 24b) and the conductors 26a to 26f constitute one magnetic sensor of the present invention.

In the present embodiment, each of the linear segments of the magnetoresistance elements 23 and 24 is split into two subsegments; however, each of the linear segments may be split into three or more subsegments. In this case also, a plurality of linear subsegments formed by splitting the linear segment of the magnetoresistance element 23 are inclined in the same direction, and a plurality of linear subsegments formed by splitting the linear segment of the magnetoresistance element 24 are inclined in the same direction. Also, as shown in FIG. 3(B), each of the linear segments of the magnetoresistance elements 23 and 24 may be unsplit and have the form of a single linear segment provided on the upper surface of the substrate 22 in such a manner as to be inclined with respect to the Y-axis direction. In this case, one ends of the linear segments of the magnetoresistance elements 23 and 24 are connected to the terminals 27a and 27b provided on the substrate 22 through the conductors 26a and 26b, respectively, as in the aforementioned case. The other ends of the linear segments of the magnetoresistance elements 23 and 24 are connected to each other through the conductor 26f, thereby connecting the magnetoresistance elements 23 and 24 in series; and a point of connection between the magnetoresistance elements 23 and 24 is connected to the terminal 27c provided on the substrate 22 through the conductor 26c. In this case, the two magnetoresistance elements 23 and 24 and the conductors 26a to 26c and 26f constitute one magnetic sensor of the present invention.

Furthermore, as shown in FIG. 3(C), a portion extended in the Y-axis direction of each of the magnetoresistance elements 23 and 24 may be folded such that each of the magnetoresistance elements 23 and 24 has two linear segments. In this case, the magnetoresistance element 23 is composed of a pair of linear segments 23A and 23B; the linear segment 23A is composed of linear subsegments 23a and 23b as in the aforementioned case; and the linear segment 23B is composed of linear subsegments 23c and 23d. The linear subsegments 23c and 23d and the linear subsegments 23a and 23b are provided on the upper surface of the substrate 22 such that the linear subsegments 23c and 23d face and are in parallel with the linear subsegments 23a and 23b, respectively. The magnetoresistance element 24 is composed of a pair of linear segments 24A and 24B; the linear segment 24A is composed of linear subsegments 24a and 24b as in the aforementioned case; and the linear segment 24B is composed of linear subsegments 24c and 24d. The linear subsegments 24c and 24d and the linear subsegments 24a and 24b are provided on the upper surface of the substrate 22 such that the linear subsegments 24c and 24d face and are in parallel with the linear subsegments 24a and 24b, respectively.

The other end of the linear subsegment 23c is connected to one end of the linear subsegment 23d through a conductor 26g, and the other ends of the linear subsegments 23b and 23d are connected to each other through a conductor 26h, whereby the linear subsegments 23a and 23b and the linear subsegments 23c and 23d are connected in series in a folded manner. The other end of the linear subsegment 24c is connected to one end of the linear subsegment 24d through a conductor 26i, and the other ends of the linear subsegments 24b and 24d are connected to each other through a conductor 26j, whereby the linear subsegments 24a and 24b and the linear subsegments 24c and 24d are connected in series in a folded manner. In this case, one end of the linear subsegment 23a of the magnetoresistance element 23 and one end of the linear subsegment 24a of the magnetoresistance element 24 are connected to the terminals 27a and 27b provided on the substrate 22 through the conductors 26a and 26b, respectively, as in the aforementioned case. One end of the linear subsegment 23c of the magnetoresistance element 23 and one end of the linear subsegment 24c of the magnetoresistance element 24 are connected to each other through a conductor 26k, whereby the magnetoresistance elements 23 and 24 are connected in series; and a point of connection between the magnetoresistance elements 23 and 24 is connected to the terminal 27c provided on the substrate 22 through the conductor 26c. In this case, the two magnetoresistance elements 23 and 24 (linear segments 23A, 23B, 24A, and 24B) and the conductors 26a to 26e and 26g to 26k constitute one magnetic sensor of the present invention.

Next, there is described the reason why the extending directions of the magnetoresistance elements 23 and 24 (linear segments of the magnetoresistance elements 23 and 24) are inclined with respect to the Y-axis direction in the upper surface (plane) of the substrate 22. In order to stably change resistances, in response to a magnetic field, of the magnetoresistance elements 23 and 24; i.e., the ferromagnetic thin film magnetoresistance elements formed of AMR, magnetic force in a fixed direction must be applied in the longitudinal direction of the magnetoresistance elements 23 and 24; i.e., in a direction of an easy axis of magnetization. In other words, in the case where the magnetoresistance elements 23 and 24 are extended in the Y-axis direction, lines of magnetic force generated by the magnets 12 and 13 pass basically in the X-Z plane; thus, magnetic force is not generated in the magnetoresistance elements 23 and 24, and the operation of the magnetoresistance elements 23 and 24 is unstable. Thus, in the present embodiment, the extending directions of the magnetoresistance elements 23 and 24 are inclined by a predetermined angle with respect to the Y-axis direction on the upper surface of the substrate 22 so as to stabilize the operation of the magnetoresistance elements 23 and 24.

Figure 4:
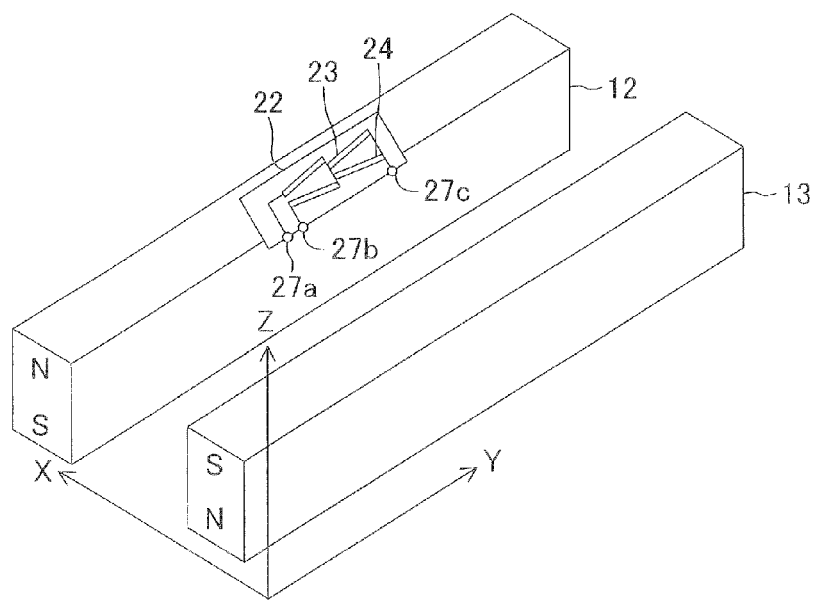
FIG. 4 (A) is a perspective view of the substrate and magnets for explaining a disposition example of the magnetoresistance elements on the substrate, and (B) is an explanatory view for explaining magnetic fluxes generated in longitudinal directions of the magnetoresistance elements.
Figure 4:
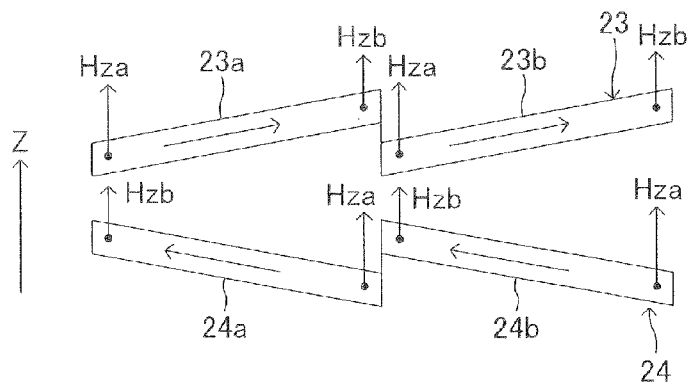

This configurational feature will be described by use of the substrate 22 having the magnetoresistance elements 23 and 24 configured as shown in FIG. 3(A); in a state in which the substrate 22 is attached to the substrate support member 21 as shown in FIG. 1, as shown in FIG. 4(A), the upper surface of the substrate 22 is inclined by about 45 degrees (an angle ranging from 10 degrees to 65 degrees) with respect to the upper surfaces of the magnets 12 and 13; i.e., the X-Y plane. Accordingly, as shown in FIG. 4(B), a difference arises among distances (distances in the Z-axis direction) from the upper surfaces of the magnets 12 and 13 to opposite ends of the linear subsegments 23a, 23b, 24a, and 24b of the magnetoresistance elements 23 and 24. Thus, a magnetic force Hza applied to those ends of the linear subsegments 23a, 23b, 24a, and 24b which are located closer to the upper surfaces of the magnets 12 and 13 is greater than a magnetic force Hzb applied to those ends of the linear subsegments 23a, 23b, 24a, and 24b which are located farther from the upper surfaces of the magnets 12 and 13 (Hza>Hzb). The difference Hza−Hzb between the magnetic forces Hza and Hzb generates magnetic flux in the linear subsegments 23a, 23b. 24a, and 24b of the magnetoresistance elements 23 and 24 in the illustrated directions. By means of increasing the magnetic-force difference Hza−Hzb to a certain extent, the magnetoresistance elements 23 and 24 are stabilized. Thus, the linear subsegments 23a, 23b, 24a, and 24b of the magnetoresistance elements 23 and 24 are inclined by a certain angle with respect to the Y-axis direction for implementing the stabilization. This also applies to the aforementioned variously modified magnetoresistance elements 23 and 24.

The flexible printed circuit substrate 25 is a slender, flexible printed circuit substrate having electric circuit components disposed thereon and adapted for use in electric wiring, is prepared in a quantity of the same number as that of the substrate support members 21 and the substrates 22 (in the present embodiment, 14 pieces), and is electrically connected to and fixed to the substrate 22. In assembling the substrate support members 21, the substrates 22, and the flexible printed circuit substrates 25, as shown in FIG. 2(B), the substrates 22 are fixed to the respective substrate support members 21, and the flexible printed circuit substrates 25 are fixed to the respective substrates 22. The magnetoresistance elements 23 and 24 and the conductors 26a to 26f are formed beforehand on the substrates 22 by sputtering or a like process. The assemblies of the substrate support member 21, the substrate 22, and the flexible printed circuit substrate 25 are disposed on the magnets 12 and on the magnet fixing members 14 such that the bottom surfaces of the substrate support members 21 are fixedly affixed to the upper surfaces of the magnets 12 and to the upper surfaces of the magnet fixing members 14 located toward the magnets 12; subsequently, lower end portions of the flexible printed circuit substrates 25 are inserted downward from above through the through holes 14a of the magnet fixing members 14 and the through holes 11a of the case 11, respectively (the state of FIG. 2(C)). Subsequently, the cover 15 is put on the case 11 from above (the state of FIG. 2(D)). The cover 15 is elastically fixed to the case 11.

Figure 5:
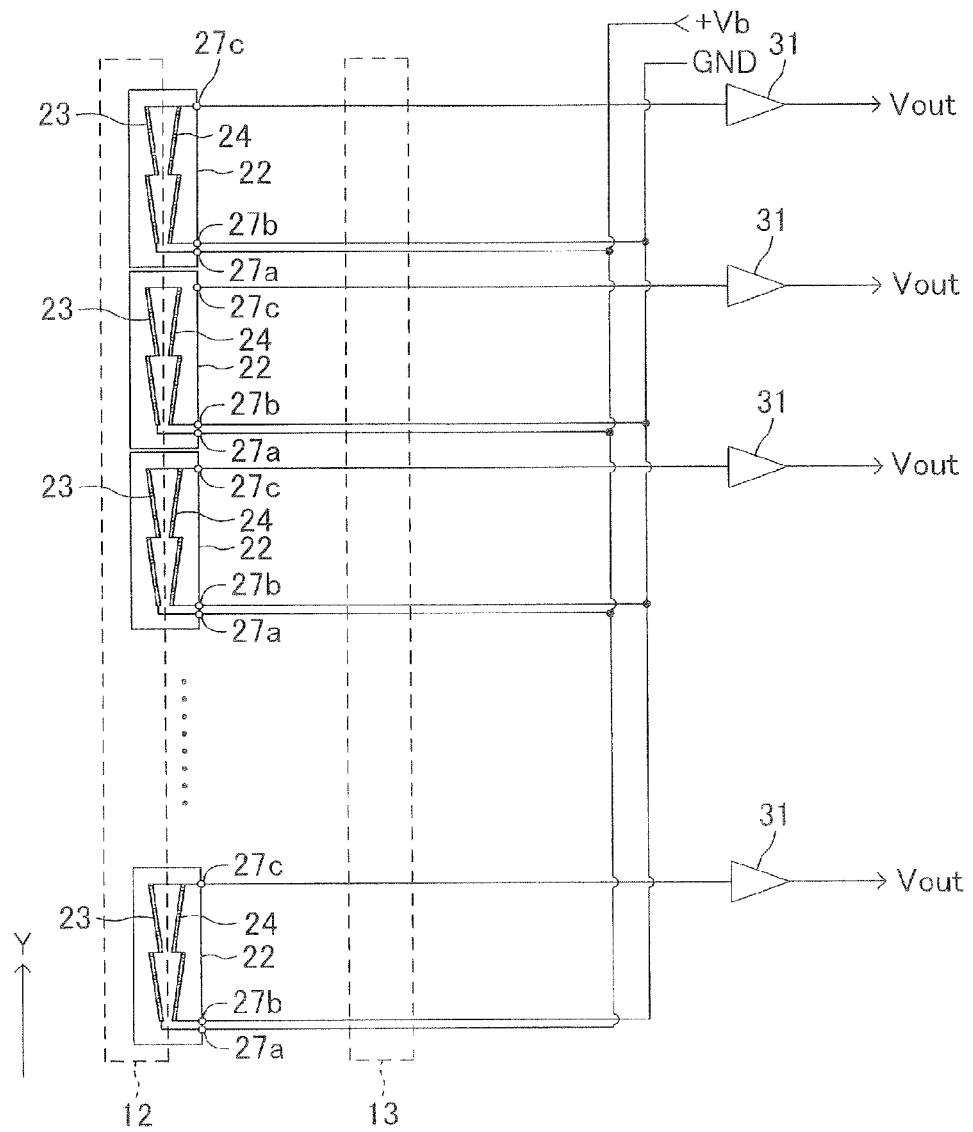
FIG. 5 Diagram showing an electric circuit on a flexible printed circuit substrate.

Electric wiring is formed on the flexible printed circuit substrate 25, thereby forming an electric circuit including a half-bridge circuit of the magnetoresistance elements 23 and 24. As shown in FIG. 5, the electric circuit is such that a DC voltage +Vb is applied to the terminals 27a of the plurality of substrates 22; the terminals 27b are grounded (GND); and amplifiers 31 are connected to the terminals 27c, respectively. Thus, the DC voltage +Vb is applied between the magnetoresistance elements 23 and 24 connected in series, and the output voltage Vout is output through the amplifiers 31. These circuits may be provided on circuit devices connected to the flexible printed circuit substrates 25 rather than on the flexible printed circuit substrates 25.

Next, the dispositional relation between the magnets 12 and 13 and the magnetoresistance elements 23 and 24 will be described in detail. In a state in which the object OB to be verified (magnetic substance MS) does not exist, lines of magnetic force directed from the magnet 12 toward the magnet 13 assume an elliptic form in the X-Z plane as indicated by the arrows in FIGS. 6(A) and 6(B). In a path of the lines of magnetic force, a plane which contains the moving direction L of the object OB to be verified exists, and the magnetoresistance elements 23 and 24 on the substrate 22 are located between the plane and the magnet 12. In this case, the magnets 12 and 13 and the substrate 22 having the magnetoresistance elements 23 and 24 formed thereon are disposed such that, in the X-Z plane, a line of magnetic force is perpendicular to the plane which contains the magnetoresistance elements 23 and 24; i.e., the upper surface of the substrate 22, at a center position Po between the magnetoresistance element 23 and the magnetoresistance element 24 (a position where the distance to the magnetoresistance element 23 and the distance to the magnetoresistance element 24 are equal to each other) on a straight line which connects the magnetoresistance element 23 and the magnetoresistance element 24. Therefore, in the X-Z plane, the direction of a line of magnetic force passing through the magnetoresistance element 23 (a line-of-magnetic-force vector H1) and the direction of a line of magnetic force passing through the magnetoresistance element 24 (a line-of-magnetic-force vector H2) are inclined substantially symmetrically outward with respect to a line of magnetic force passing through the center position Po (a line-of-magnetic-force vector Ho). In other words, the line-of-magnetic-force vectors H1 and H2 are inclined in opposite directions with respect to a plane which is in parallel with the Y-axis direction and orthogonal to the upper surface of the substrate 22. Since the distance between the magnetoresistance elements 23 and 24 is small, the line-of-magnetic-force vectors H1 and H2 have substantially the same magnitude.

Furthermore, when the line-of-magnetic-force vectors H1 and H2 are split into horizontal components H1x and H2x and vertical components H1y and H2y in parallel with and perpendicular to the upper surface of the substrate 22, respectively, the horizontal components H1x and H2x are directed opposite to each other and have substantially the same magnitude. The vertical components H1y and H2y are directed in the same direction and have substantially the same magnitude.

Figure 7:
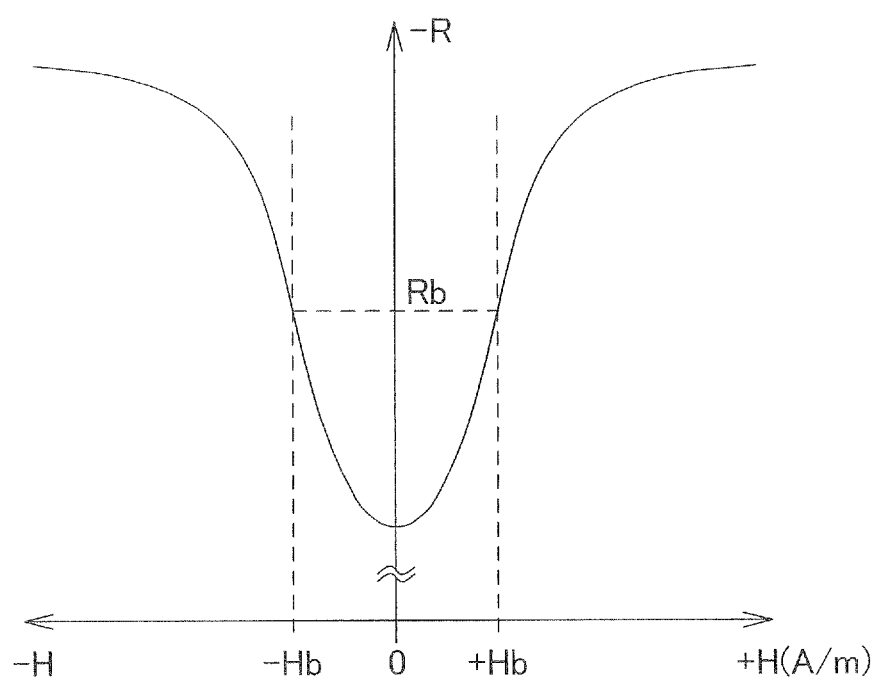
FIG. 7 Graph showing the characteristic of a change in the resistance of the magnetoresistance element in response to the intensity of a magnetic field.

Meanwhile, there will be described a characteristic of a ferromagnetic thin film magnetoresistance element (anisotropic magnetoresistance element) used to form the magnetoresistance elements 23 and 24 regarding a change in resistance in relation to a magnetic field. As shown in FIG. 7, the resistance between opposite ends, along the extending direction, of the ferromagnetic thin film magnetoresistance element is maximized when the intensity of a magnetic field in a direction orthogonal to the extending direction of the ferromagnetic thin film magnetoresistance element in a plane where the thin film exists is "0," decreases as the absolute value of the intensity of the magnetic field increases, and becomes substantially fixed when the intensity of the magnetic field reaches that of a saturated magnetic field. Specifically, in the present embodiment, the resistance is maximized when the horizontal components H1x and H2x are "0," degreases gradually as the horizontal components H1x and H2x increase, and becomes substantially fixed when the horizontal components H1x and H2x further increase and reach the intensity of the saturated magnetic field.

Therefore, preferably, the magnets 12 and 13 apply bias magnetic fields to the magnetoresistance elements 23 and 24 such that, in response to passage of the object OB to be verified (magnetic substance MS), the resistances of the magnetoresistance elements 23 and 24 change to the greatest extent without being saturated. Thus, in a state in which the object OB to be verified (magnetic substance MS) does not exist, the horizontal components H1x and H2x with which the resistances of the magnetoresistance elements 23 and 24 assume an average value (center value) of maximal resistances assumed by the magnetoresistance elements 23 and 24 in the course of change of magnetic field and resistances assumed by the magnetoresistance elements 23 and 24 at the time of application of the saturated magnetic field are set as bias magnetic fields. In this case, as mentioned above, in the state in which the object OB to be verified (magnetic resistance MS) does not exist, the horizontal components H1x and H2x are directed opposite to each other and have substantially the same magnitude; thus, the intensity of magnetic field of the magnets 12 and 13, the distances between the magnets 12 and 13 and the magnetoresistance elements 23 and 24, etc., are set such that, as shown in FIG. 7, the horizontal components H1x and H2x become bias magnetic fields +Hb and −Hb, respectively. In FIG. 7, the reference resistance Rb indicates the resistances of the magnetoresistance elements 23 and 24 in a state in which the bias magnetic fields +Hb and −Hb are applied, as the horizontal components H1x and H2x, to the magnetoresistance elements 23 and 24. The reference resistance Rb is substantially equal to the average value of maximal resistances assumed by the magnetoresistance elements 23 and 24 in the course of change of magnetic field and resistances assumed by the magnetoresistance elements 23 and 24 at the time of application of the saturated magnetic field.

Figure 6:
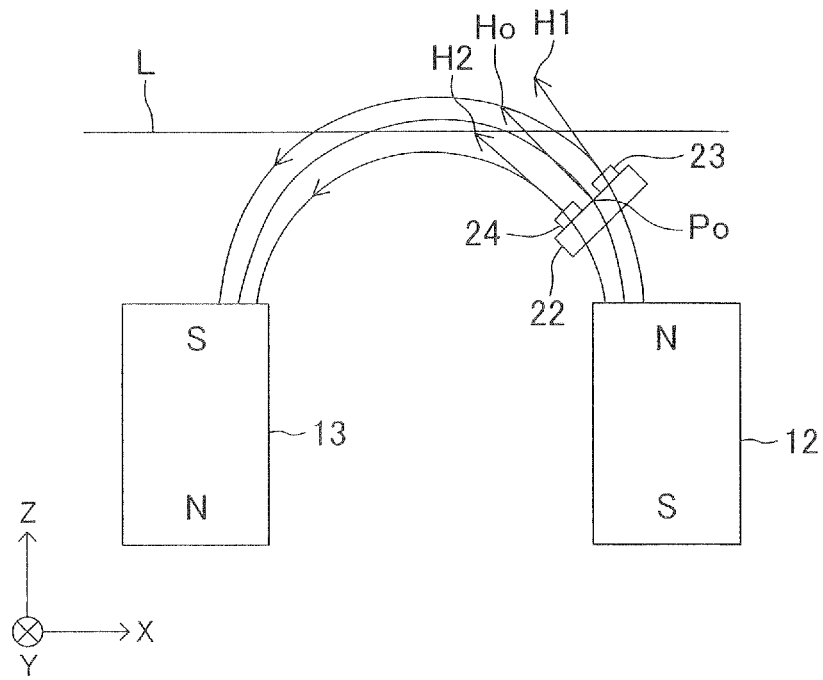
FIG. 6 (A) is a view showing the disposition of the magnetoresistance elements in relation to lines of magnetic force between the magnets, and (B) is an enlarged explanatory view for explaining the state of lines of magnetic force passing through the magnetoresistance elements shown in (A).
Figure 6:
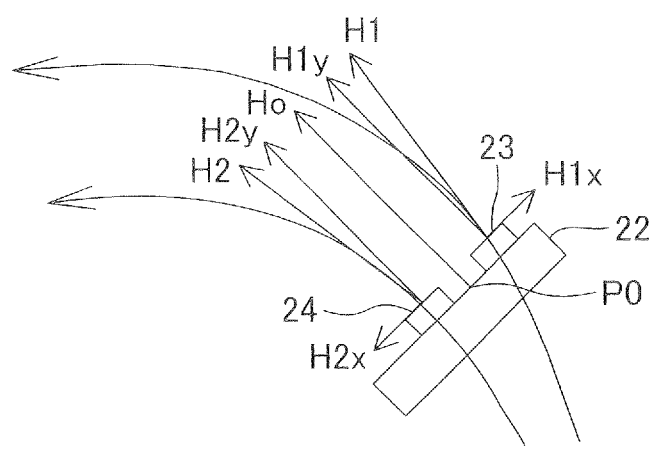

Thus, in a state in which the bias magnetic field +Hb is applied to the magnetoresistance element 23, the resistance of the magnetoresistance element 23 gradually reduces from the reference resistance Rb as the absolute value |H1x| of the horizontal component H1x increases with respect to the bias magnetic field +Hb (increase in the positive direction corresponding to the upper right direction in FIG. 6(B)), and gradually increases from the reference resistance Rb as the absolute value |H1x| of the horizontal component H1x reduces (reduction in the positive direction corresponding to the upper right direction in FIG. 6(B)). The resistance of the magnetoresistance element 24 gradually reduces from the reference resistance Rb as the absolute value |H2x| of the horizontal component H2x increases with respect to the bias magnetic field −Hb (increase in the negative direction corresponding to the lower left direction in FIG. 6(B)), and gradually increases from the reference resistance Rb as the absolute value |H2x| of the horizontal component H2x reduces (reduction in the negative direction corresponding to the lower left direction in FIG. 6(B)). Notably, as will be described hereinafter, the present embodiment does not involve the phenomenon that, as the magnetic field changes in response to movement of the magnetic substance MS, the horizontal component H1x of the magnetic field passing through the magnetoresistance element 23 becomes negative, and the horizontal component H2x of the magnetic field passing through the magnetoresistance element 24 becomes positive.

Next, the operation of the thus-configured magnetic substance detection device according to the first embodiment will be described. As shown in FIG. 1, the object OB to be verified which has the magnetic substance MS is moved in the moving direction L above the magnetic substance detection device. The magnetic substance MS slenderly extends in the Y-axis direction in the object OB to be verified. In a state in which the magnetic substance MS is located far from the magnetoresistance elements 23 and 24, since the magnetic field produced by the magnets 12 and 13 and passing through the magnetoresistance elements 23 and 24 is not influenced by the magnetic substance MS, the horizontal components H1x and H2x of the line-of-magnetic-force vectors H1 and H2 at the magnetoresistance elements 23 and 24 are held at the bias magnetic fields +Hb and −Hb, respectively, and the resistances between the opposite ends of the magnetoresistance elements 23 and 24 are held at the reference resistance Rb. When the magnetic substance MS approaches the magnetoresistance elements 23 and 24, the magnetic field produced by the magnets 12 and 13 and passing through the magnetoresistance elements 23 and 24 begins being influenced by the magnetic substance MS; accordingly, the horizontal components H1x and H2x of the line-of-magnetic-force vectors H1 and H2 at the magnetoresistance elements 23 and 24 change, whereby the resistances between the opposite ends of the magnetoresistance elements 23 and 24 begin changing.

Figure 8:
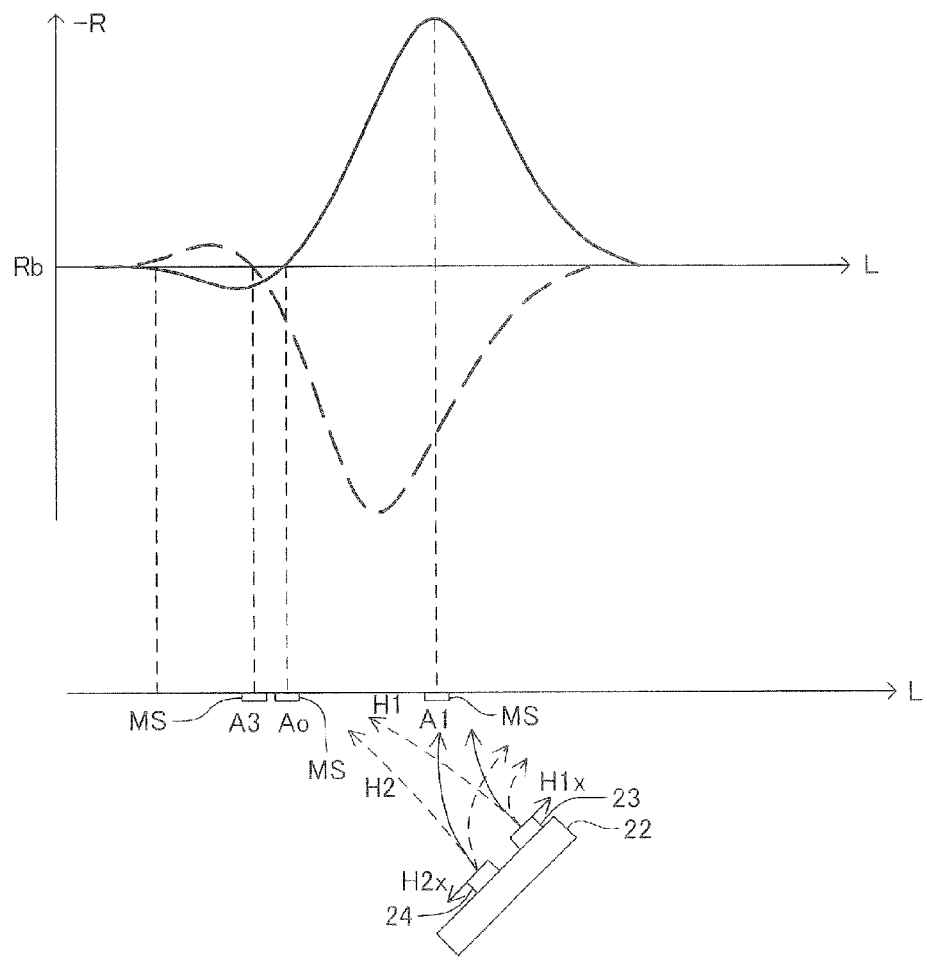
FIG. 8 Graph showing the characteristics of a change in the resistances of the magnetoresistance elements in response to movement of the magnetic substance.

First, a change in the resistance of the magnetoresistance element 23 will be described; as shown in FIG. 8, in a state in which the magnetic substance MS exists near the magnetoresistance element 23, when the magnetic substance MS is located at a position Ao where the line-of-magnetic-force vector H1 is the same as that in a state in which the magnetic substance MS does not exist, the horizontal component H1x of the line-of-magnetic-force vector H1 passing through the magnetoresistance element 23 is the bias magnetic field Hb, and the resistance of the magnetoresistance element 23 is the reference resistance Rb. When the magnetic substance MS moves rightward from the position Ao in the moving direction L, the lines of magnetic force are pulled rightward by the magnetic substance MS; accordingly, the horizontal component H1x of the line-of-magnetic-force vector H1 passing through the magnetoresistance element 23 becomes greater than the bias magnetic field Hb, and the resistance of the magnetoresistance element 23 reduces gradually from the reference resistance Rb. An A1 position of the magnetic substance MS is where the horizontal component H1x is maximized, and the resistance of the magnetoresistance element 23 is minimized. However, when the magnetic substance MS moves further rightward from the A1 position, the lines of magnetic force are pulled further rightward; thus, the lines of magnetic force passing through the magnetoresistance element 23 reduce, so that the horizontal component H1x begins reducing, the resistance of the magnetoresistance element 23 gradually increases to become equal to the reference resistance Rb. Then, when the magnetic substance MS moves further rightward and loses influence on the magnetic field, the horizontal component H1x of the line-of-magnetic-force vector H1 passing through the magnetoresistance element 23 returns to the bias magnetic field +Hb, and the resistance of the magnetoresistance element 23 returns to the reference resistance Rb.

Meanwhile, in a state in which the magnetic substance MS is located leftward of and in the vicinity of the position Ao, as a result of the magnetic substance MS pulling the lines of magnetic force, the line-of-magnetic-force vector H1 passing through the magnetoresistance element 23 is inclined leftward; the horizontal component Hx1 becomes smaller than the bias magnetic field +Hb; and the resistance of the magnetoresistance element 23 becomes greater than the reference resistance Rb. However, in this case, as compared with the case where the magnetic substance MS is located rightward of the position Ao, since the magnetic substance MS is located more distant from the magnetoresistance element 23, a change in resistance of the magnetoresistance element 23 is small. When the magnetic substance MS moves further leftward, the line-of-magnetic-force vector H1 approaches that in a state in which the magnetic substance MS does not exist; the horizontal component H1x begins increasing; and the resistance of the magnetoresistance element 23 gradually reduces to become equal to the reference resistance Rb. Then, when the magnetic substance MS moves further leftward and loses influence on the magnetic field, the horizontal component H1x of the line-of-magnetic-force vector H1 passing through the magnetoresistance element 23 returns to the bias magnetic field +Hb, and the resistance of the magnetoresistance element 23 returns to the reference resistance Rb. The resistance of the magnetoresistance element 23 changes in response to the position of the magnetic substance MS along the moving direction L as represented by the solid line graph in FIG. 8.

Regarding the magnetoresistance element 24, when the magnetic substance MS is located at a position A3 where the line-of-magnetic-force vector H2 is the same as that in a state in which the magnetic substance MS does not exist, the horizontal component H2x of the line-of-magnetic-force vector H2 passing through the magnetoresistance element 24 is the bias magnetic field −Hb, and the resistance of the magnetoresistance element 24 is the reference resistance Rb. In this case, the line-of-magnetic-force vector H2 is in a symmetrical relation with the line-of-magnetic-force vector H1 with respect to the line-of-magnetic-force vector Ho passing through the center position between the magnetoresistance elements 23 and 24 perpendicular to the upper surface of the substrate 22; and the horizontal component H2$x$ of the line-of-magnetic-force H2 is opposite the horizontal component H1$x$ with respect to the positive and negative directions to become the bias magnetic field −Hb. Therefore, the resistance of the magnetoresistance element 24 changes in response to the position of the magnetic substance MS in the moving direction L such that a change of the resistance of the magnetoresistance element 23 is substantially inverted with respect to the reference resistance Rb as represented by the broken line of FIG. 8. The difference between the position Ao and the position A3 derives from the positional difference between the magnetoresistance elements 23 and 24 on the upper surface of the substrate 22; and, since the distance between the magnetoresistance elements 23 and 24 is small, the distance between the positions Ao and A3 is short.

In this manner, in response to the movement in the moving direction L of the object OB to be verified which has the magnetic substance MS, the resistances of the magnetoresistance elements 23 and 24 change as shown in the graph of FIG. 8. Meanwhile, as shown in the electric circuit diagram of FIG. 5, the magnetoresistance elements 23 and 24 are connected in series, and a DC voltage (+Vb, GND) is applied to the opposite ends of the connected magnetoresistance elements 23 and 24. Voltage at a point of connection between the magnetoresistance elements 23 and 24 is output as the output voltage Vout through the amplifier 31. Therefore, the output voltage Vout corresponds to the difference between changes of the resistances of the magnetoresistance elements 23 and 24 (the difference between the solid line graph and the broken line graph in FIG. 8). As a result, the output voltage Vout corresponds to two times a change of the resistance of the magnetoresistance element 23 (or the magnetoresistance element 24). In the aforementioned description, one magnetic sensor composed of the magnetoresistance elements 23 and 24 has been discussed; however, in the case of a plurality of magnetic sensors composed of a plurality of pairs each consisting of the magnetoresistance elements 23 and 24, the output voltage Vout is similarly output from each of the amplifiers 31. As a result, the magnetic substance MS extending in the Y-axis direction and provided in the object OB to be verified can be detected by means of the output voltages Vout.

In the magnetic substance detection device which is configured and operates as mentioned above, the two magnets 12 and 13 are formed into an elongated shape and disposed in such a manner as to extend in the Y-axis direction in parallel with each other, and are magnetized opposite to each other in the Z-axis direction. Thus, lines of magnetic force between the magnets 12 and 13 are generated elliptically in the X-Z plane, and, even though some error is involved in formation of the shapes, particularly the shapes of magnetic pole faces, of the magnets 12 and 13, the lines of magnetic force are stabilized in direction, and the lines of magnetic force passing through the magnetoresistance elements 23 and 24 are fixed in direction at all times. As a result, the bias magnetic fields +Hb and −Hb applied to the magnetoresistance elements 23 and 24, respectively, are stabilized rather than fluctuate; thus, a change of the resistances of the magnetoresistance elements 23 and 24 in response to movement of the magnetic substance MS can be stabilized, whereby the magnetic substance MS can be detected with high accuracy. Also, through adjustment of the distance between the magnets 12 and 13, the shape of loci of magnetic force can be modified in various manners, thereby simplifying setting of the bias magnetic fields +Hb and −Hb for the magnetoresistance elements 23 and 24.

Figure 9:
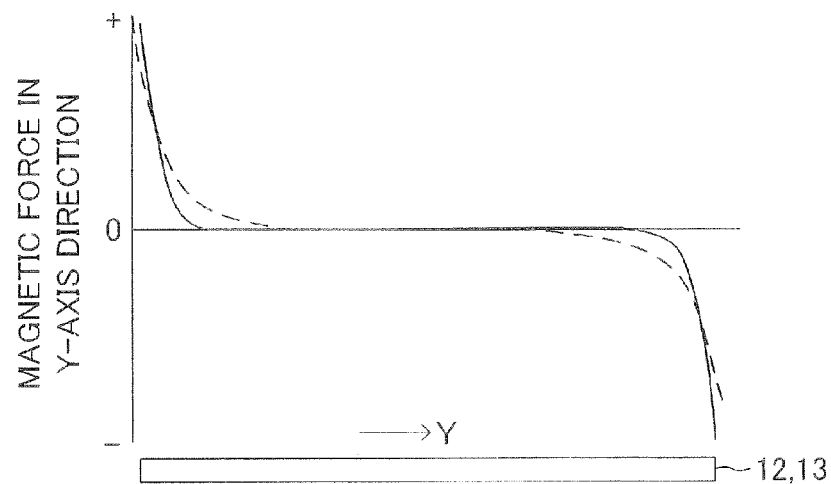
FIG. 9 (A) is a graph showing a change, along an extending direction of a magnet, in magnetic force in the extending direction of the magnet in the case of provision of two magnets and in the case of provision of one magnet, and (B) is a graph showing a change, along the extending direction, in magnetic force in a plane formed by the extending direction of the magnet and the magnetizing direction of the magnet in the case of provision of two magnets and in the case of provision of one magnet.
Figure 9:
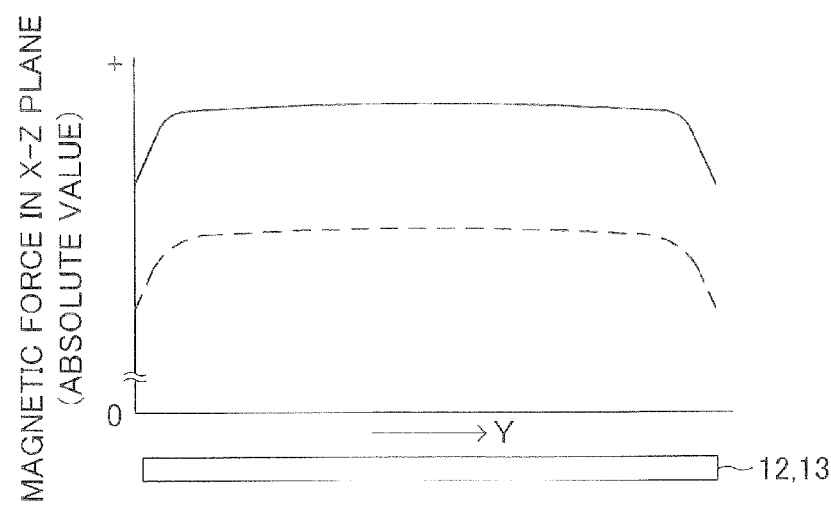

Furthermore, it has been found that the provision of two magnets 12 and 13 stabilizes magnetic force in the Y-axis direction and magnetic force in the X-Z plane along the Y-axis direction. FIGS. 9(A) and 9(B) are graphs showing a change along the Y-axis direction in magnetic force in the Y-axis direction and magnetic force in the X-Z plane by the solid lines for the case where the two magnets 12 and 13 are provided, and by the broken lines for the case where only one magnet is provided as described in the BACKGROUND ART section. As is understood from the graphs of FIGS. 9(A) and 9(B), as compared with the case of provision of only one magnet, in the case of provision of the two magnets 12 and 13, magnetic force in the Y-axis direction and magnetic force in the X-Z plane are stabilized along the Y-axis direction over wider ranges, respectively. As a result, through provision of the two magnets 12 and 13 as in the above first embodiment, a change in resistances of the magnetoresistance elements 23 and 24; i.e., the existence of the magnetic substance MS, can be accurately detected over a wide range along the extending direction of the elongated magnets 12 and 13.

In the first embodiment described above, the extending directions of the magnetoresistance elements 23 and 24 or the linear subsegments 23$a$ to 23$d$ and 24$a$ to 24$d$ of the magnetoresistance elements 23 and 24 are inclined with respect to the Y-axis direction on the upper surface of the substrate 22. Thus, by means of the difference between the components Hza and Hzb in the Z-axis direction of lines of magnetic force generated by the magnets 12 and 13 at opposite ends of the magnetoresistance elements 23 and 24 or the linear subsegments 23$a$ to 23$d$ and 24$a$ to 24$d$ of the magnetoresistance elements 23 and 24, magnetic fluxes in fixed directions are generated in the magnetoresistance elements 23 and 24 or the linear subsegments 23$a$ to 23$d$ and 24$a$ to 24$d$ of the magnetoresistance elements 23 and 24 along the extending directions, whereby a change in resistances of the magnetoresistance elements 23 and 24 can be stabilized. As a result, accuracy in detecting the magnetic substance MS by the magnetic substance detection device can be enhanced.

Also, in the first embodiment described above, the case 11 is formed of a magnetic material (stainless steel, which is a soft magnetic substance) and covers the magnetic pole faces of the magnets 12 and 13 located opposite the magnetoresistance elements 23 and 24. Thus, the distribution of lines of magnetic force generated by the magnets 12 and 13 and located toward the magnetoresistance elements 23 and 24 can be free from influence of an external magnetic field and thus stabilized, whereby accuracy in detecting the magnetic substance MS by the magnetic substance detection device can be enhanced.

Also, in the first embodiment described above, the elongated magnetoresistance elements 23 and 24 are disposed in parallel with each other and in a mutually facing condition on the upper surface of the substrate 22 which is disposed in such a manner as to be inclined with respect to the X-Y plane; and, lines of magnetic force generated by the magnets 12 and 13 pass through the substrate 22 in such a manner as to be perpendicular to the upper surface of the substrate 22 at a center position between the magnetoresistance elements 23 and 24. Thus, the bias magnetic fields applied in a direction orthogonal to the extending direction of the magnetoresistance elements 23 and 24 in the upper plane of the substrate 22 are directed substantially in opposite directions and have the same magnitude, so that the magnetoresistance elements 23 and 24 can change their resistances substantially symmetrically in mutually opposite positive and negative directions in response to the movement of the magnetic substance MS in the X-axis direction, thereby facilitating utilization of a change in resistances of the magnetoresistance elements 23 and 24. Also, the magnetoresistance elements 23 and 24 which constitute one magnetic sensor are half-bridge-connected for obtaining the output voltage Vout; therefore, as compared with the case of use of one magnetoresistance element, a change in the output voltage Vout can be increased.

Figure 10:
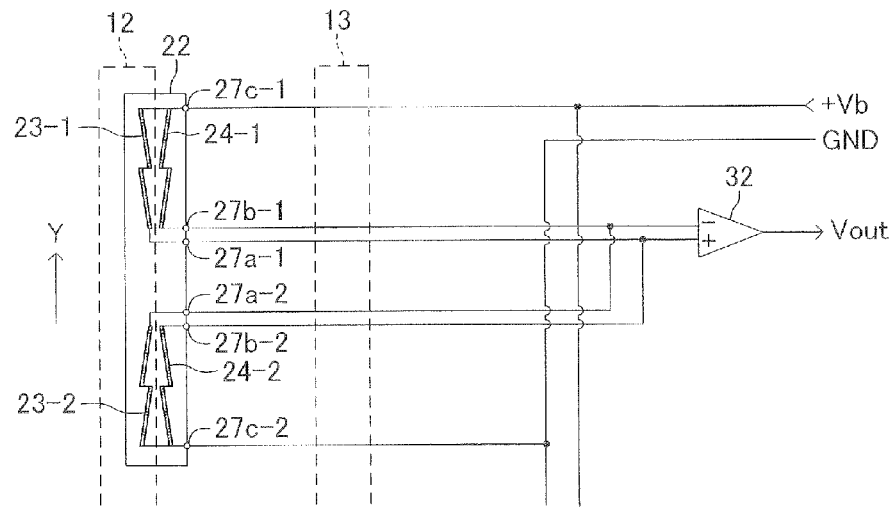
FIG. 10 (A) is an electric circuit diagram showing an example of the disposition and connections of full-bridge-connected magnetoresistance elements of a magnetic sensor, and (B) is an electric circuit diagram showing another example of the disposition and connections of full-bridge-connected magnetoresistance elements of a magnetic sensor.
Figure 10:
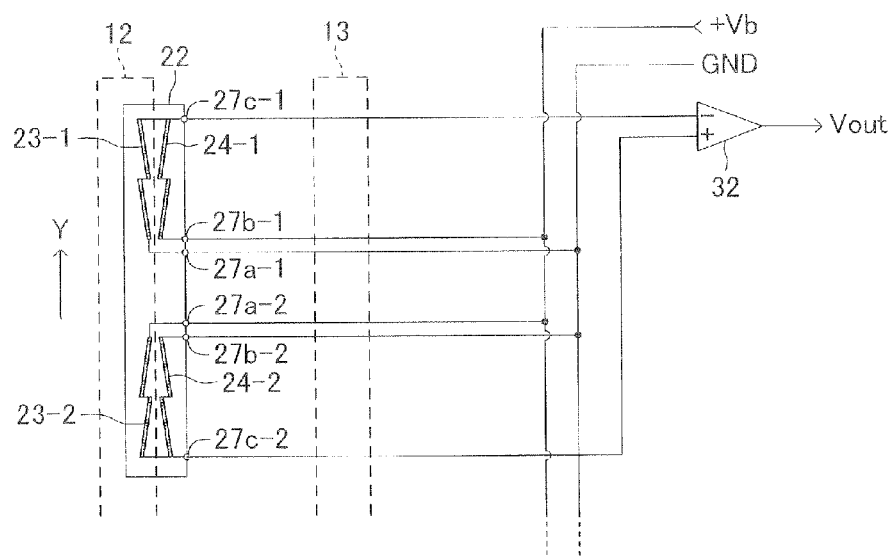

In the first embodiment described above, as mentioned above, the magnetoresistance elements 23 and 24 which constitute one magnetic sensor are half-bridge-connected for obtaining the output voltage Vout. However, this configuration may be replaced with the following configuration: one magnetic sensor is composed of four magnetoresistance elements 23-1, 23-2, 24-1, and 24-2; and, the magnetoresistance elements 23-1, 23-2, 24-1, and 24-2 are full-bridge-connected for obtaining the output voltage Vout. In this case, as shown in FIG. 10(A), the magnetoresistance elements 23-1, 23-2, 24-1, and 24-2 are provided on the upper surface of one substrate 22. The magnetoresistance elements 23-1 and 24-1 are formed similarly to the magnetoresistance elements 23 and 24 mentioned above, and conductors on the substrate are also similar to those in the case of the magnetoresistance elements 23 and 24. Regarding terminals, terminals 27a-1, 27b-1, and 27c-1 correspond to the above-mentioned terminals 27a, 27b, and 27c, respectively. The magnetoresistance elements 23-2 and 24-2, terminals 27a-2, 27b-2, and 27c-2, and conductors for connecting the elements and the terminals are configured similarly to the case of the magnetoresistance elements 23-1 and 24-1, the terminals 27a-1, 27b-1, and 27-c1, and the conductors for connecting the elements and the terminals, and are provided symmetrically with respect to the Y-axis direction; i.e., at positions extended in the Y-axis direction from the magnetoresistance elements 23-1 and 24-1 on the upper surface of the substrate 22, the magnetoresistance elements 23-2 and 24-2 are disposed on the upper surface of the substrate 22 in such a manner as to extend substantially along the Y-axis direction and to face each other. However, the following configuration may be employed: the magnetoresistance elements 23-1 and 24-1, the terminals 27a-1, 27b-1, and 27c-1, and the conductors for connecting the elements and the terminals are provided on one substrate 22, and the magnetoresistance elements 23-2 and 24-2, the terminals 27a-2, 27b-2, and 27c-2, and the conductors for connecting the elements and the terminals are provided on the other substrate 22.

On the flexible printed circuit substrate 25, the terminals 27a-1, 27b-1, and 27c-1, and the terminals 27a-2, 27b-2, and 27c-2 are electrically connected as follows. The DC voltage +Vb is applied to the terminal 27c-1, and the terminal 27c-2 is grounded (GND). The terminal 27a-1 and the terminal 27b-2 are connected, and a point of connection therebetween is connected to a non-inverting input of an amplifier 32. The terminal 27b-1 and the terminal 27a-2 are connected, and a point of connection therebetween is connected to an inverting input of the amplifier 32. Thus, the magnetoresistance elements 23-1 and 24-2 are connected in series; a voltage Vb-GND is applied to the opposite ends of the connected magnetoresistance elements 23-1 and 24-2; and voltage at the point of connection between the magnetoresistance elements 23-1 and 24-2 is supplied to the non-inverting input of the amplifier 32. Also, the magnetoresistance elements 24-1 and 23-2 are connected in series; the voltage Vb-GND is applied to the opposite ends of the connected magnetoresistance elements 24-1 and 23-2; and voltage at the point of connection between the magnetoresistance elements 24-1 and 23-2 is supplied to the non-inverting input of the amplifier 32. The amplifier 32 outputs a differential voltage between the non-inverting input and the inverting input as the output voltage Vout.

Through such connections, a full bridge circuit is formed; thus, in response to movement of the magnetic substance MS, the resistances of the magnetoresistance elements 23-1 and 24-2 change in mutually opposite positive and negative directions, and the resistances of the magnetoresistance elements 23-2 and 24-1 change in mutually opposite positive and negative directions; and voltage at the point of connection between the magnetoresistance element 23-1 and the magnetoresistance element 24-2 and voltage at the point of connection between the magnetoresistance element 24-1 and the magnetoresistance element 23-2 also change in mutually opposite positive and negative directions. Also, the voltages at the two points of connection are supplied to the non-inverting input and the inverting input, respectively, of the amplifier 31, and the amplifier 31 outputs a differential voltage between the two points of connection; therefore, the amplifier 31 actually outputs the output voltage Vout corresponding to the sum of voltages at the two points of connection. As a result, the output voltage Vout to be obtained can be two times greater than in the case of the half bridge connection mentioned above.

By virtue of the amplifier 32 outputting the differential voltage between the two points of connection, even though noises are contained respectively in the horizontal component H1x which brings about a change in the resistances of the magnetoresistance elements 23-1 and 23-2, and in the horizontal component H2x which brings about a change in the resistances of the magnetoresistance elements 24-1 and 24-2, the changes in the resistances caused by the noises cancel each other, thereby improving the S/N ratio of the output voltage Vout.

Furthermore, the magnetoresistance elements 23-1, 23-2, 24-1, and 24-2 and the amplifier 32 may be full-bridge-connected as shown in FIG. 10(B) in place of the aforementioned full bridge connection of FIG. 10(A). Specifically, the DC voltage +Vb is applied to the terminals 27b-1 and 27a-2, and the terminals 27a-1 and 27b-2 are grounded (GND). The terminal 27c-1 is connected to the inverting input of the amplifier 32, and the terminal 27c-2 is connected to the non-inverting input of the amplifier 32. Thus, the magnetoresistance elements 24-1 and 23-1 are connected in series; the voltage Vb-GND is applied to the opposite ends of the connected magnetoresistance elements 24-1 and 23-1: and voltage at a point of connection between the magnetoresistance elements 24-1 and 23-1 is supplied to the inverting input of the amplifier 32. Also, the magnetoresistance elements 23-2 and 24-2 are connected in series; the voltage Vb-GND is applied to the opposite ends of the connected magnetoresistance elements 23-2 and 24-2; and voltage at a point of connection between the magnetoresistance elements 23-2 and 24-2 is supplied to the non-inverting input of the amplifier 32. The amplifier 32 outputs a differential voltage between the non-inverting input and the inverting input as the output voltage Vout.

Through such connections also, a full bridge circuit is formed; thus, in response to movement of the magnetic substance MS, the resistances of the magnetoresistance elements 23-2 and 24-2 change in mutually opposite positive and negative directions, and the resistances of the magnetoresistance elements 24-1 and 23-1 change in mutually opposite positive and negative directions; and voltage at the point of connection between the magnetoresistance element 23-2 and the magnetoresistance element 24-2 and voltage at the point of connection between the magnetoresistance element 24-1 and the magnetoresistance element 23-1 also change in mutually opposite positive and negative directions. Also, the voltages at the two points of connection are supplied to the non-inverting input and the inverting input, respectively, of the amplifier 32, and the amplifier 32 outputs a differential voltage between the two points of connection; therefore, in this case also, the amplifier 32 actually outputs the output voltage Vout corresponding to the sum of voltages at the two points of connection; thus, similar to the aforementioned case, the output voltage Vout to be obtained can be two times greater than in the case of the half bridge connection mentioned above.

In this case also, by virtue of the amplifier 32 outputting the differential voltage between the two points of connection, even though noises are contained respectively in the horizontal component H1x which brings about a change in the resistances of the magnetoresistance elements 23-1 and 23-2, and in the horizontal component H2x which brings about a change in the resistances of the magnetoresistance elements 24-1 and 24-2, the noises cancel each other, thereby improving the S/N ratio of the output voltage Vout.

Figure 11:
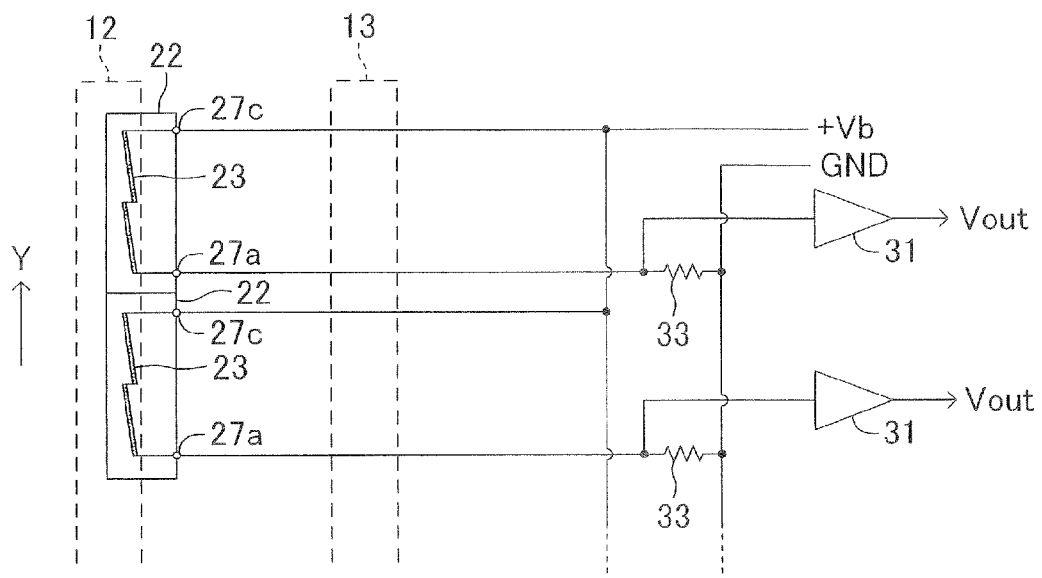
FIG. 11 Electric circuit diagram showing a magnetic sensor which uses one magnetoresistance element.

Furthermore, one magnetic sensor may be composed of one magnetoresistance element rather than a plurality of magnetoresistance elements 23 and 24 (or 23-1, 23-2, 24-1, and 24-2). In this case, as shown in FIG. 11, only the magnetoresistance element 23 is provided on the upper surface of the substrate 22, and the DC voltage +Vb is applied to the terminal 27c. The magnetoresistance elements 23, conductors, and the terminals 27a and 27c are configured similarly to the case of the first embodiment described above. The terminal 27a is connected to one end of a fixed resistance 33 provided on the flexible printed circuit substrate 25, and the other end of the fixed resistance 33 is grounded (GND). A point of connection between the magnetoresistance element 23 and the fixed resistance 33 is connected to the input of the amplifier 31, and the amplifier 31 outputs the output voltage Vout.

Even in such a configuration, since there can be obtained the output voltage Vout which changes according to a change in resistance of the magnetoresistance element 23 which is effected in response to movement of the magnetic substance MS, the magnetic substance MS contained in the object OB to be verified can be detected. However, the output voltage Vout in this case is about one-half that in the case of the first embodiment described above.

The magnetoresistance elements 23, 24, 23-1, 23-2, 24-1, and 24-2 in FIGS. 10(A) and 10(B) and FIG. 11 showing modifications of the first embodiment described above may each be split into three or more linear segments or may each assume the form of one linear segment as have been described with reference to FIGS. 3(A) and 3(B). Also, as have been described with reference to FIG. 3(C), a portion extended in the Y-axis direction of each of the magnetoresistance elements 23, 24, 23-1, 23-2, 24-1, and 24-2 may be folded such that each of the magnetoresistance elements has two or more linear segments.

b. Second Embodiment

Figure 12:
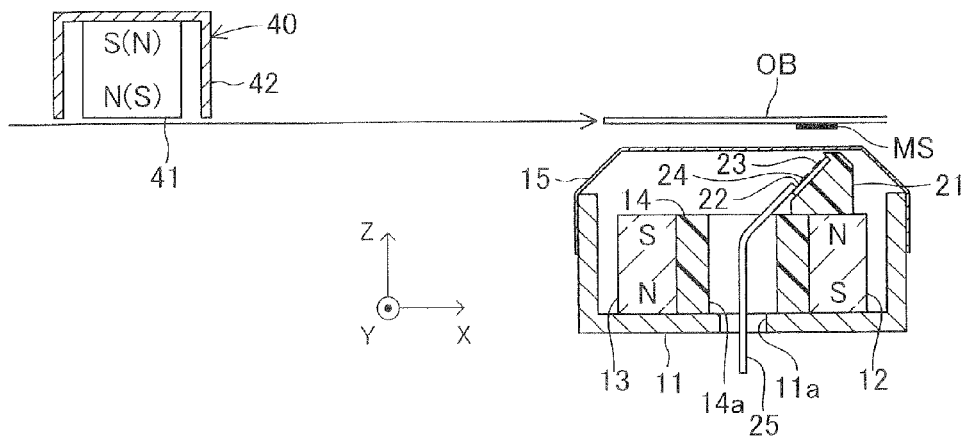
FIG. 12 Schematic longitudinal sectional view of a magnetic substance detection device according to a second embodiment of the present invention.

Next, a second embodiment of the present invention will be described with reference to FIG. 12. In the second embodiment, the magnetic substance detection device has a magnetizer 40 for magnetizing the magnetic substance MS contained in the object OB to be verified to a predetermined condition before detection of the magnetic substance MS is performed by the magnetic substance detection device as described in the section of the first embodiment. In the case where the magnetic substance MS contained in the object OB to be verified is formed of a soft magnetic substance, the existence of the magnetic substance MS can be accurately detected by the magnetic substance detection device according to the first embodiment described above; however, in the case where the magnetic substance MS is formed of a hard magnetic substance, the magnetic substance MS may be magnetized beforehand; the magnetic substance MS may be magnetized by a magnetic substance detection device such as that of the first embodiment; or the magnetic substance MS may be magnetized by an external magnetic field. If the magnetic substance MS formed of a hard magnetic substance is magnetized in such a manner, the above-mentioned lines of magnetic force generated by the magnets 12 and 13 are affected by magnetic force of the magnetic substance MS; consequently, a change in the resistances of the magnetoresistance elements 23 and 24 caused by the above-mentioned line-of-magnetic-force vectors H1 and H2 fails to become uniform, resulting in a failure to accurately detect a change in the resistances; i.e., a failure to accurately detect the magnetic substance MS.

The magnetizer 40 is disposed along the moving direction L of the object OB to be verified and has a magnet 41, which is a permanent magnet. The magnet 41 generates relatively strong lines of magnetic force in a direction perpendicular to the plane of the moving object OB to be verified and is magnetized such that a face toward the object OB to be verified is magnetized to, for example, the North Pole, and a face opposite the object OB to be verified is magnetized to the South Pole. The direction of magnetization may be inverted such that the face toward the object OB to be verified is magnetized to, for example, the South Pole, and the face opposite the object OB to be verified is magnetized to the North Pole. The magnet 41 is disposed within a housing box 42 formed of a magnetic material (e.g., stainless steel, which is a soft magnetic substance) as in the case of the case 11. The housing box 42 is formed in such a manner as to cover the magnet 41 except its face which faces the object OB to be verified, whereby magnetic force generated by the magnet 41 does not affect lines of magnetic force generated by the magnets 12 and 13. Notably, there is no need to provide the housing box 42 so long as the magnet 41 is located away from the magnets 12 and 13 to such an extent as not to affect the magnets 12 and 13. Other configurational members are similar to those of the magnetic substance detection device of the first embodiment described above and, thus, are denoted by the same reference numerals as those of the first embodiment, and repeated description thereof is omitted.

In the thus-configured second embodiment, when the magnetic substance MS formed of a hard magnetic substance and contained in the object OB to be verified passes by the magnetizer 40, even though the magnetic substance MS is already magnetized in various ways, the magnetic substance MS is magnetized by the magnetizer 40 to a fixed condition at all times and then moves to a position above the magnets 12 and 13 and the magnetoresistance elements 23 and 24. In this case also, similar to the case of the first embodiment described above, the line-of-magnetic-force vectors H1 and H2 generated by the magnets 12 and 13 are influenced by the passage of the magnetic substance MS and change in response to the passage of the magnetic substance MS, whereby the resistances of the magnetoresistance elements 23 and 24 change accordingly. In this case, a change in the resistances of the magnetoresistance elements 23 and 24 resembles that in the case of the first embodiment described above, but somewhat differs from that in the case of the first embodiment, since the line-of-magnetic-force vectors H1 and H2 including the horizontal components H1$x$ and H2$x$ are influenced by lines of magnetic force generated by the magnetic substance MS.

Figure 13:
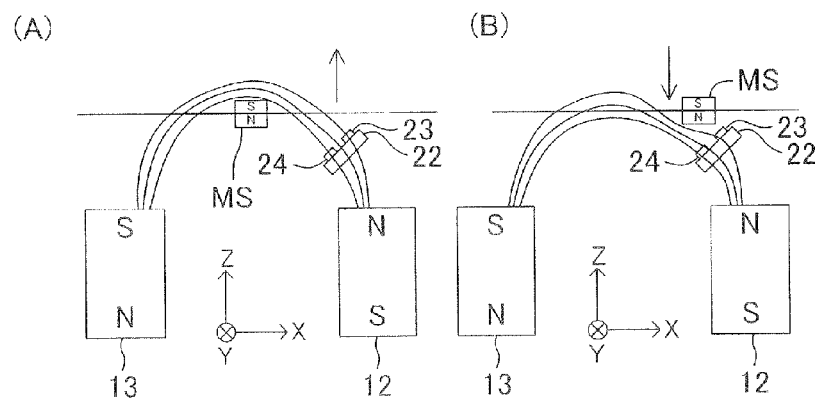
FIGS. 13 (A) and (B) are explanatory views for explaining a change of lines of magnetic force passing through the magnetoresistance elements in response to passage of a magnetized magnetic substance.
Figure 14:
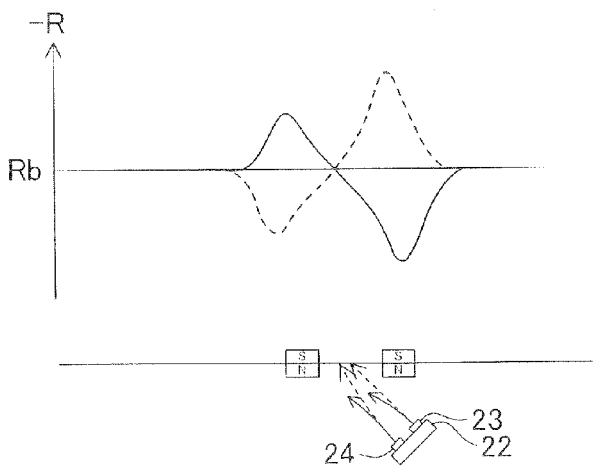
FIG. 14 Graph showing an example of characteristics of a change in the resistances of the magnetoresistance elements in response to movement of the magnetic substance in the second embodiment.

For example, in the case where the lower face of the magnet 41 is magnetized to the North Pole, the upper surface of the magnetic substance MS contained in the object OB to be verified is magnetized to the South Pole, and the lower surface is magnetized to the North Pole. Therefore, as shown in FIG. 13(A), when the magnetic substance MS is located between the magnets 12 and 13 and relatively away from the magnetoresistance elements 23 and 24, lines of magnetic force generated by the magnets 12 and 13 and passing through the magnetoresistance elements 23 and 24 are pulled upward in the Z-axis direction. Then, as shown in FIG. 13(B), when the magnetic substance MS is located between the magnets 12 and 13 and in the vicinity of the magnetoresistance elements 23 and 24, the lines of magnetic force generated by the magnets 12 and 13 and passing through the magnetoresistance elements 23 and 24 are repelled and pressed downward in the Z-axis direction. As a result, the resistance of the magnetoresistance element 23 changes as represented by the solid line of FIG. 14, and the resistance of the magnetoresistance element 24 changes as represented by the broken line of FIG. 14. Thus, although the output voltage Vout differs in characteristic from that of the first embodiment, in the second embodiment also, similar to the case of the first embodiment, the magnetoresistance elements 23 and 24 are half-bridge-connected, and the output voltage Vout from a half bridge circuit is stabilized, so that the existence of the magnetic substance MS can be accurately detected by use of the output voltage Vout. Also, even though the magnetic substance MS formed of a hard magnetic substance is magnetized in various ways, by virtue of new magnetization by the magnetizer 40, the output voltage Vout is in a fixed condition at all times, whereby the existence of the magnetic substance MS can be accurately detected.

Figure 15:
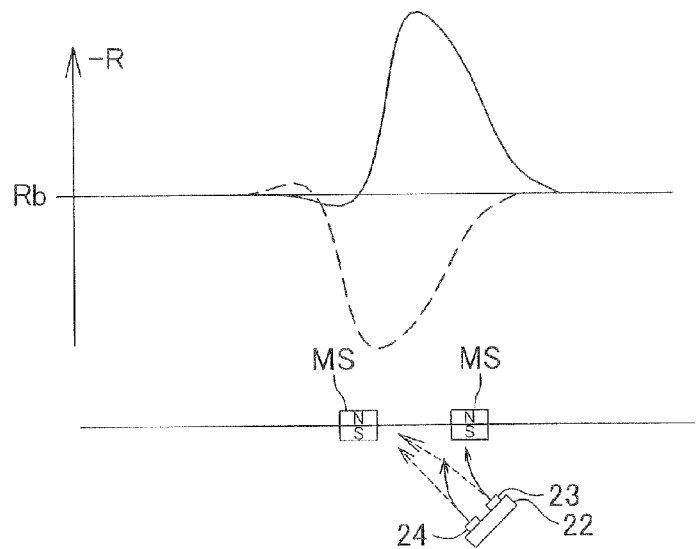
FIG. 15 Graph showing another example of characteristics of a change in the resistances of the magnetoresistance elements in response to movement of the magnetic substance in the second embodiment.

In the case where the lower face of the magnet 41 is magnetized to the South Pole, the upper surface of the magnetic substance MS contained in the object OB to be verified is magnetized to the North Pole, and the lower surface is magnetized to the South Pole. Therefore, in this case, as a result of passage through the magnetic substance MS, the lines of magnetic force generated by the magnets 12 and 13 are pulled toward the magnetic substance MS more strongly than in the case of the first embodiment described above. In this case, the resistance of the magnetoresistance element 23 changes in response to the movement of the magnetic substance MS as represented by the solid line of FIG. 15, and the resistance of the magnetoresistance element 24 changes as represented by the broken line of FIG. 15. Therefore, in this case also, similar to the case of the first embodiment, the magnetoresistance elements 23 and 24 are half-bridge-connected, and the output voltage Vout from a half bridge circuit is stabilized, so that the existence of the magnetic substance MS can be accurately detected by use of the output voltage Vout. In this case also, even though the magnetic substance MS formed of a hard magnetic substance is magnetized in various ways, by virtue of new magnetization by the magnetizer 40, the output voltage Vout is in a fixed condition at all times, whereby the existence of the magnetic substance MS can be accurately detected.

The above description refers to the magnetic substance MS formed of a hard magnetic substance; however, the magnetic substance detection device according to the second embodiment can be utilized for detecting the magnetic substance MS formed of a soft magnetic substance. In the case where the magnetic substance MS is a soft magnetic substance, magnetization of the magnetic substance MS by the magnet 41 is removed before the magnetic substance MS moves to a position in the vicinity of the magnetoresistance elements 23 and 24. Then, in the vicinity of the magnetoresistance elements 23 and 24, the magnetic substance MS responds to a magnetic field generated by the magnets 12 and 13 similarly to the case of the embodiment described above. As a result, in this case also, the output voltage Vout to be obtained is similar to that in the case of the first embodiment; thus, the magnetic substance MS can be detected in a manner similar to the case of the first embodiment.

Figure 16:
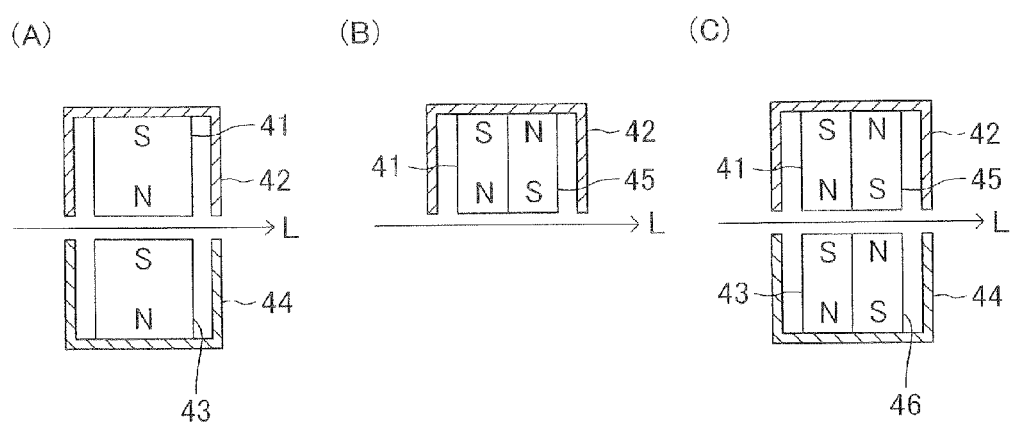
FIG. 16 (A) to (C) are views showing examples of disposition of magnets in a magnetizer for magnetizing the magnetic substance.

In the present second embodiment, the magnet 41 is provided above, in the Z-axis direction, a path of movement of the magnetic substance MS; however, the magnet 41 may be provided under the path. Also, as shown in FIG. 16(A), a magnet 43 and a housing box 44 may be additionally provided under the path of movement of the magnetic substance MS. In this case, the opposed magnetic pole faces of the upper and lower magnets 41 and 43 are magnetized to mutually opposite magnetic poles. Also, as shown in FIG. 16(B), a magnet 45 may be juxtaposed to the magnet 41 in the housing box 42; in this case, the magnetic pole face of the magnet 41 located toward the path of the magnetic substance MS and the magnetic pole face of the magnet 45 located toward the path are magnetized to mutually opposite magnetic poles. Also, as shown in FIG. 16(C), two magnets 43 and 46 housed in the housing box 44 may be disposed under the path of the magnetic substance MS in such a manner as to face the magnets 41 and 45 housed in the housing box 42 shown in FIG. 16(B).

Also, in place of the magnetizer 40 which uses the permanent magnets 41, 43, 45, and 46, the magnetizer 40 which uses an electromagnet may be provided. In this case, in detection of the resistances of the magnetoresistance elements 23 and 24 formed of a hard magnetic substance, the electromagnet is operated to magnetize the magnetic substance MS for detecting a change in the resistances of the magnetoresistance elements 23 and 24. In detection of the resistances of the magnetoresistance elements 23 and 24 formed of a soft magnetic substance, the electromagnet is not operated so as to not magnetize the magnetic substance MS for detecting a change in the resistances of the magnetoresistance elements 23 and 24.

Furthermore, in the magnetic substance detection device according to the second embodiment, the various modifications described above in the section of the first embodiment can also be applied.

The present invention has been described with reference to the first and second embodiments. However, the present invention is not limited thereto, but may be modified in various forms without departing from the object of the present invention.

The invention claimed is:

1. A magnetic substance detection device for detecting a magnetic substance contained in an object to be verified which moves in a first direction, comprising:
an elongated first magnet and an elongated second magnet which extend in parallel with a second direction orthogonal to the first direction and are magnetized opposite to each other in a third direction orthogonal to the first and second directions; and
a magnetic sensor having a ferromagnetic thin film magnetoresistance element which has a linear segment extending substantially along the second direction on a plane of a substrate disposed in a path of lines of magnetic force between the first magnet and the second magnet and changes resistance thereof in response to a change of a magnetic field directed in a direction orthogonal to the second direction in the plane of the substrate;
the magnetic substance detection device being characterized in that the first magnet and the second magnet apply a bias magnetic field lower in intensity than a saturated magnetic field of the ferromagnetic thin film magnetoresistance element to the ferromagnetic thin film magnetoresistance element in the direction orthogonal to the second direction in the plane of the substrate,
wherein the magnetic sensor has a first magnetoresistance element and a second magnetoresistance element provided at the same position along the second direction on the plane of the substrate, the first magnetoresistance element and the second magnetoresistance element being formed of respective ferromagnetic thin film magnetoresistance elements and having linear segments facing each other, and
wherein the plane of the substrate is inclined by a predetermined angle with respect to the first direction such that lines of magnetic force generated by the first and second magnets pass through the plane of the substrate in such a manner as to be perpendicular to the plane of the substrate at a center position between the first magnetoresistance element and the second magnetoresistance element, so that the bias magnetic field applied in said direction to the first magnetoresistance element becomes substantially opposite in direction to the bias magnetic field applied in said direction to the second magnetoresistance element.

2. The magnetic substance detection device according to claim 1, wherein
the plane of the substrate is inclined with respect to the first direction, and
the linear segment of the ferromagnetic thin film magnetoresistance element extends on the plane of the substrate and is inclined by a predetermined angle with respect to the second direction in the plane of the substrate.

3. The magnetic substance detection device according to claim 1, further comprising a covering member which is formed of a magnetic substance and covers magnetic pole faces of the first and second magnets opposite the magnetic sensor.

4. The magnetic substance detection device according to claim 1, further comprising an electric circuit in which the first magnetoresistance element and the second magnetoresistance element are connected in series, and a predetermined voltage is applied between opposite ends of the connected first and second magnetoresistance elements for outputting voltage at a point of connection between the first magnetoresistance element and the second magnetoresistance element.

5. The magnetic substance detection device according to claim 1, wherein
the magnetic sensor further has a third magnetoresistance element and a fourth magnetoresistance element provided at positions extended in the second direction from the first magnetoresistance element and the second magnetoresistance element on the plane of the substrate, the third and fourth magnetoresistance elements being formed of respective ferromagnetic thin film magnetoresistance elements and having linear segments which extend substantially along the second direction on the plane of the substrate and which face each other, and the third and fourth magnetoresistance elements having resistances which change in response to a change in a magnetic field directed in a direction orthogonal to the second direction in the plane of the substrate;
the magnetic substance detection device is configured such that lines of magnetic force generated by the first and second magnets pass through the plane of the substrate in such a manner as to be perpendicular to the plane of the substrate at a center position between the third magnetoresistance element and the fourth magnetoresistance element, so that the bias magnetic field applied in said direction to the third magnetoresistance element becomes substantially opposite in direction to the bias magnetic field applied in said direction to the fourth magnetoresistance element, and the bias magnetic field applied in said direction to the third magnetoresistance element becomes the same in direction as the bias magnetic field applied in said direction to the first magnetoresistance element; and
the magnetic substance detection device further comprises an electric circuit in which a terminal of the first magnetoresistance element located toward the third magnetoresistance element is connected to a terminal of the fourth magnetoresistance element located toward the second magnetoresistance element, a terminal of the second magnetoresistance element located toward the fourth magnetoresistance element is connected to a terminal of the third magnetoresistance element located toward the first magnetoresistance element, a terminal of the first magnetoresistance element located opposite the third magnetoresistance element is connected to a terminal of the second magnetoresistance element located opposite the fourth magnetoresistance element, a terminal of the third magnetoresistance element located opposite the first magnetoresistance element is connected to a terminal of the fourth magnetoresistance element located opposite the second magnetoresistance element, and a predetermined voltage is applied between a point of connection between the first magnetoresistance element and the second magnetoresistance element and a point of connection between the third magnetoresistance element and the fourth magnetoresistance element for outputting a differential voltage between a voltage at the point of connection between the first magnetoresistance element and the fourth magnetoresistance element and a voltage at the point of connection between the second magnetoresistance element and the third magnetoresistance element.

6. The magnetic substance detection device according to claim 1, wherein the magnetic sensor further has a third magnetoresistance element and a fourth magnetoresistance element provided at positions extended in the second direction from the first magnetoresistance element and the second magnetoresistance element on the plane of the substrate, the third and fourth magnetoresistance elements being formed of respective ferromagnetic thin film magnetoresistance elements and having linear segments which extend substantially along the second direction on the plane of the substrate and which face each other, and the third and fourth magnetoresistance elements having resistances which change in response to a change in a magnetic field directed in a direction orthogonal to the second direction in the plane of the substrate;

the magnetic substance detection device is configured such that lines of magnetic force generated by the first and second magnets pass through the plane of the substrate in such a manner as to be perpendicular to the plane of the substrate at a center position between the third magnetoresistance element and the fourth magnetoresistance element, so that the bias magnetic field applied in said direction to the third magnetoresistance element becomes substantially opposite in direction to the bias magnetic field applied in said direction to the fourth magnetoresistance element, and the bias magnetic field applied in said direction to the third magnetoresistance element becomes the same in direction as the bias magnetic field applied in said direction to the first magnetoresistance element; and the magnetic substance detection device further comprises an electric circuit in which a terminal of the first magnetoresistance element located opposite the third magnetoresistance element is connected to a terminal of the second magnetoresistance element located opposite the fourth magnetoresistance element, a terminal of the third magnetoresistance element located opposite the first magnetoresistance element is connected to a terminal of the fourth magnetoresistance element located opposite the second magnetoresistance element, a terminal of the first magnetoresistance element located toward the third magnetoresistance element is connected to a terminal of the fourth magnetoresistance element located toward the second magnetoresistance element, a terminal of the second magnetoresistance element located toward the fourth magnetoresistance element is connected to a terminal of the third magnetoresistance element located toward the first magnetoresistance element, and a predetermined voltage is applied between a point of connection between the first magnetoresistance element and the fourth magnetoresistance element and a point of connection between the second magnetoresistance element and the third magnetoresistance element for outputting a differential voltage between a voltage at the point of connection between the first magnetoresistance element and the second magnetoresistance element and a voltage at the point of connection between the third magnetoresistance element and the fourth magnetoresistance element.

7. The magnetic substance detection device according to claim 1, further comprising a magnetizer disposed at a position located away from the magnetic sensor and adapted to magnetize the magnetic substance before the magnetic sensor detects the magnetic substance.

* * * * *